United States Patent
Ueda et al.

(10) Patent No.: US 7,545,672 B2
(45) Date of Patent: Jun. 9, 2009

(54) SPIN INJECTION WRITE TYPE MAGNETIC MEMORY DEVICE

(75) Inventors: Yoshihiro Ueda, Yokohama (JP); Kenji Tsuchida, Kawasaki (JP); Tsuneo Inaba, Kamakura (JP); Kiyotaro Itagaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 11/673,241

(22) Filed: Feb. 9, 2007

(65) Prior Publication Data

US 2007/0206406 A1 Sep. 6, 2007

(30) Foreign Application Priority Data

Mar. 3, 2006 (JP) ............... 2006-057898

(51) Int. Cl.
*G11C 11/00* (2006.01)
(52) U.S. Cl. .................. 365/158; 365/171; 257/421; 977/935
(58) Field of Classification Search .......... 365/158, 365/171, 173; 257/421, E21.665; 977/934, 977/935
See application file for complete search history.

(56) References Cited

U.S. PATENT DOCUMENTS 5,695,864 A 12/1997 Slonczewski
6,445,612 B1 * 9/2002 Naji ..................... 365/158
6,822,897 B2 11/2004 Ishikawa
2007/0206406 A1 9/2007 Ueda et al.

OTHER PUBLICATIONS

U.S. Appl. No. 12/026,885, filed Feb. 6, 2008, Inaba.
U.S. Appl. No. 11/673,241, filed Feb. 9, 2007, Ueda et al.
U.S. Appl. No. 12/032,135, filed Feb. 15, 2008, Inaba.

* cited by examiner

*Primary Examiner*—Richard Elms
*Assistant Examiner*—Harry W Byrne
(74) *Attorney, Agent, or Firm*—Oblon, Spivak, McClelland, Maier & Neustadt, P.C.

(57) ABSTRACT

A spin injection write type magnetic memory device includes memory cells which have a magnetoresistance effect element and a select transistor. The magnetoresistance effect element has one end connected to a first node. The select transistor has a first diffusion area connected to another end of the magnetoresistance effect element and a second diffusion area connected to a second node. A select line extends along a first direction and is connected to a gate electrode of the select transistor. A first interconnect extends along a second direction and is connected to the first node. A second interconnect extends along the second direction and is connected to the second node. Two of the memory cells adjacent along the first direction share the first node. Two of the memory cells adjacent along the second direction share the second node.

15 Claims, 28 Drawing Sheets

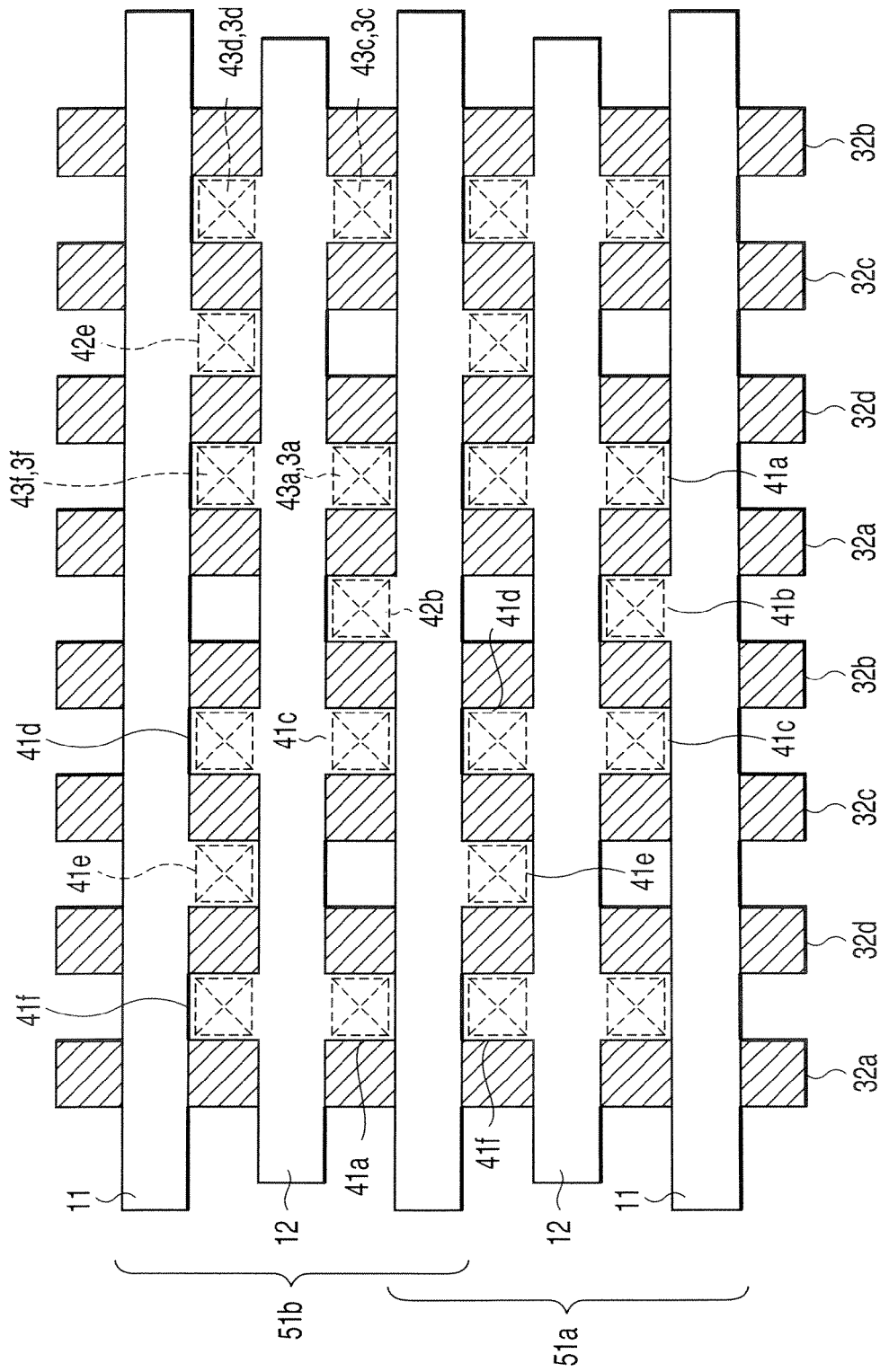
F I G. 18

SPIN INJECTION WRITE TYPE MAGNETIC MEMORY DEVICE

CROSS-REFERENCE TO RELATED APPLICATIONS

This application is based upon and claims the benefit of priority from prior Japanese Patent Application No. 2006-057898, filed Mar. 3, 2006, the entire contents of which are incorporated herein by reference.

BACKGROUND OF THE INVENTION

1. Field of the Invention

The present invention relates to the spin-injection write type magnetic memory device; for example, to the structure of a memory cell array.

2. Description of the Related Art

A magnetic random access memory (MRAM) uses a magnetoresistance effect element as a memory cell. The magnetoresistance effect element includes a free layer (recording layer) having a free magnetization (spin) direction, and a pinned layer having a fixed magnetization direction. The magnetoresistance effect element further includes a nonmagnetic layer, which is interposed between the two layers. When the magnetization direction of the free layer is parallel with that of the pinned layer, the element exhibits the low resistance. On the other hand, when the magnetization direction of the free layer is antiparallel with that of the pinned layer, the element exhibits the higher resistance. The difference of the resistance is used to record information.

To read information, a read current is carried into the magnetoresistance effect element and a current or voltage value which depends on the resistance state of the magnetoresistance effect element is compared with a reference value to determine the resistance state. To write information, current is carried through two write lines which are orthogonally cross at a memory cell to generate a magnetic field and the magnetic field switches the magnetization of the free layer. The memory cells are arrayed to configure a memory cell array.

With the scale-down of the magnetic memory device, the distance between components such as write lines and magnetoresistance effect elements is narrowed. For this reason, in the magnetic memory device using the magnetic field for writing, the magnetic field from the write line carrying a write current is highly possible to unintentionally write data in a memory cell which lies near the write line and is not a write target. This tendency more remarkably appears with the scale-down.

Moreover, the magnetic field write method requires a large current to generate a magnetic filed large enough for writing. This makes it hard to reduce power consumption.

On the contrary, spin-injection write (magnetization switching) has attracted interests (see U.S. Pat. No. 5,695, 864). This write method involves carrying a current which is spin-polarized by a magnetic moment of a pinned layer to a free layer of a magnetoresistance effect element to change its magnetization direction to write data in accordance with the current direction. According to the method, a direct action is given to nano-scale magnetic materials as compared with the magnetic field write. Therefore, unintentional write into neighboring memory cells can be avoided, and high-speed magnetization switching can be expected. Moreover, using this write method, the write current is reduced by scaling down the memory cell.

The spin-injection write method requires bi-directional write current carried into the magnetoresistance effect element in accordance with written information. Due to this requirement, attention must be given to avoid the unintentional write into unselected memory cells and write speed decrease resulting from charge/discharge of the parasitic capacity of the write line. Moreover, the spin-injection write method does not require the magnetoresistance effect element to be held between two write lines, unlike the magnetic field write method. Therefore, the connection and the positional relationship between memory cells and interconnects used in the magnetic filed write method should not be applicable to the spin-injection write method.

Arrangement of memory cells and interconnects which can realize the spin-injection write method is insufficient. In addition, high integration needs to be realized.

BRIEF SUMMARY OF THE INVENTION

According to an aspect of the present invention, there is provided a spin injection write type magnetic memory device comprising: memory cells having a magnetoresistance effect element and a select transistor, the magnetoresistance effect element having one end connected to a first node, the select transistor having a first diffusion area connected to another end of the magnetoresistance effect element and a second diffusion area connected to a second node; a select line extending along a first direction and connected to a gate electrode of the select transistor; a first interconnect extending along a second direction and connected to the first node; and a second interconnect extending along the second direction and connected to the second node, wherein two of the memory cells adjacent along the first direction share the first node, two of the memory cells adjacent along the second direction share the second node.

According to an aspect of the present invention, there is provided a spin injection write type magnetic memory device comprising: a semiconductor substrate; a first gate electrode provided on a gate insulating film provided on the semiconductor substrate, and extending along a first direction; a first diffusion area and a second diffusion area formed on a surface of the semiconductor substrate and sandwiching the first gate electrode; a first plug provided on the first diffusion area; a second plug provided on the second diffusion area; a first magnetoresistance element provided on the second plug; a second gate electrode provided on a gate insulating film provided on the semiconductor substrate, and extending in parallel with the first gate electrode; a third diffusion area and a fourth diffusion area formed on the surface of the semiconductor substrate and sandwiching the second gate electrode, the first and second gate electrode sandwiching the second and fourth diffusion areas; a third plug provided on the third diffusion area; a fourth plug provided on the fourth diffusion area; a second magnetoresistance effect element provided on the fourth plug; a first interconnect connected to upper surfaces of the first and third plugs; and a second interconnect connected to upper surfaces of the first and second magnetoresistance effect elements.

BRIEF DESCRIPTION OF THE SEVERAL VIEWS OF THE DRAWING

FIG. 18 shows a top plan view of a memory cell array according to the fifth embodiment;

DETAILED DESCRIPTION OF THE INVENTION

Figure 1:
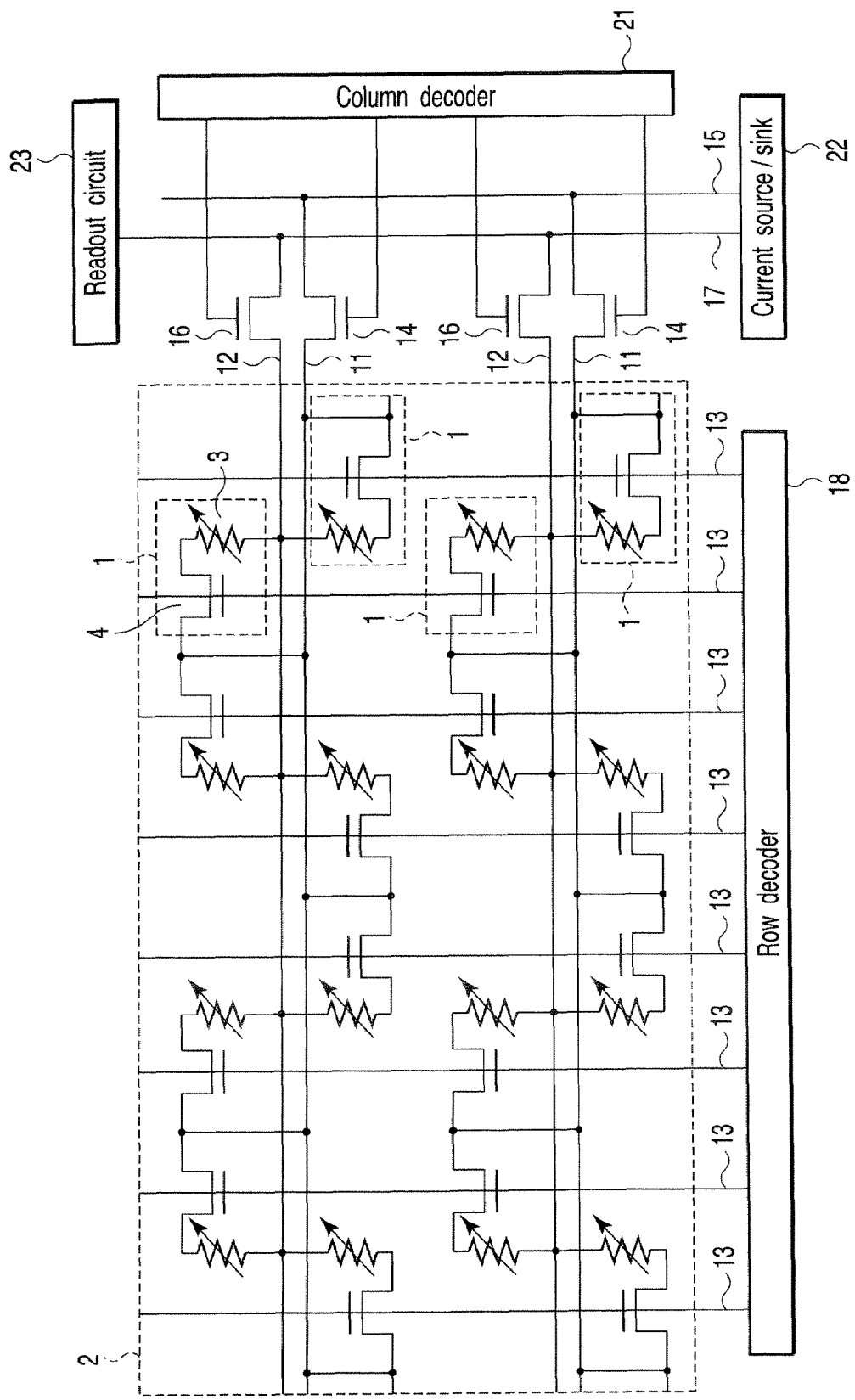
FIG. 1 is a circuit block diagram of a magnetic memory device according to a first embodiment.
Figure 2:
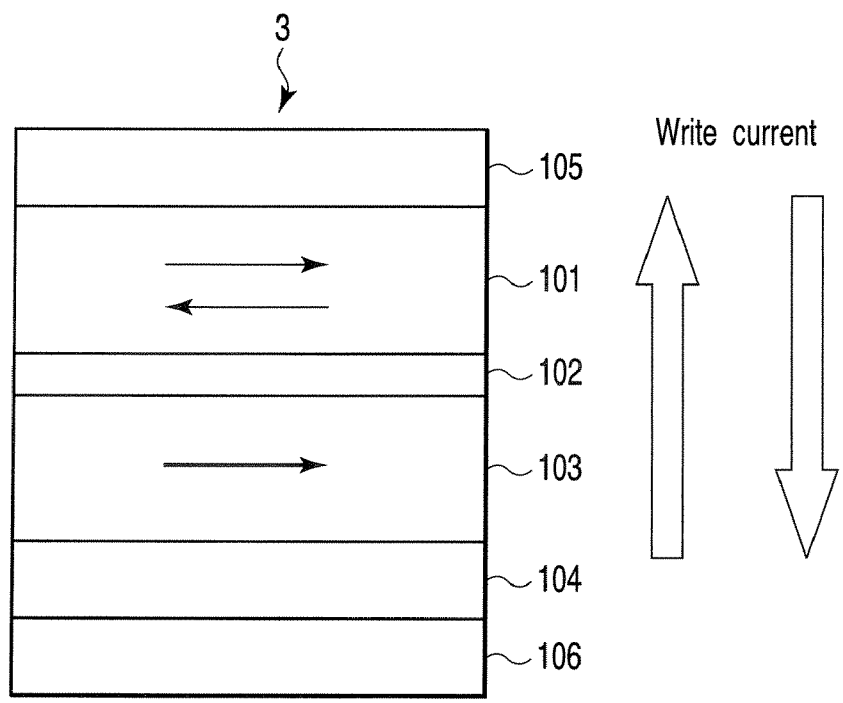
FIG. 2 shows a cross-section of a magnetoresistance effect element.

Various embodiments of the present invention will be described below with reference to the accompanying drawings. In the following description, the same reference numerals are given to components having the identical function and structure. The explanation is repeated if necessary.

First Embodiment

A magnetic memory device according to a first embodiment will be hereinafter explained with reference to FIG. 1 to FIG. 13. FIG. 1 shows a circuit block diagram of a magnetic memory device according to a first embodiment. As shown in FIG. 1, memory cells 1 are arrayed. A memory cell array 2 is composed of memory cells 1. The memory cells 1 each comprises a serially connected magnetoresistance effect element 3 and a select transistor 4.

The magnetoresistance effect element 3 has a structure capable of taking two stable states by a spin injection write. More specifically, the magnetoresistance effect element 3 includes pinned layer 103, intermediate layer 102 and free layer (recording layer) 101, which are successively stacked, as seen from FIG. 2. The pinned layer 103 is formed of a ferromagnetic material, the intermediate layer 102 is formed of a nonmagnetic material, and the free layer 101 is formed of a ferromagnetic material.

The free layer 101 and/or the pinned layer 103 may have a stacked structure comprising more than one sub-layers. The magnetization of the pinned layer 103 is fixed in one direction. This fixation can be performed by providing an antiferromagnetic layer 104 on the surface of the pinned layer 103 opposite to a nonmagnetic layer, for example.

On the contrary, no fixing mechanism is posed on the magnetization direction of the free layer 101. Therefore, the magnetization direction of the free layer 101 can change.

The intermediate layer 102 requires a predetermined thickness to provide distance between the pinned layer 103 and the free layer 101 much enough to decrease the direct interaction between them to a negligible level. The intermediate layer 102 also needs to be thinner than the diffusion length to prevent the spin direction of conduction electrons which have passed through the pinned layer 103 from changing before they reach the free layer 101 when current is carried to the magnetoresistance effect element 3. Non-magnetic metal, nonmagnetic semiconductor and insulating film can be used as the intermediate layer 102.

Moreover, the surface of the free layer 101 opposite to the nonmagnetic layer 102 may be provided with an electrode 105. The surface of the pinned layer 103 opposite to the antiferromagnetic layer 104 may be provided with an electrode 106.

An electron flow is carried from the pinned layer 103 toward the free layer 101 in order to turn around the magnetization of the free layer 101 from antiparallel state with that of the pinned layer 103 to parallel state with that of the pinned layer 103. In general, most of electron flow having passed through a magnetic material has a spin parallel with the magnetization direction of the material. Therefore, most of electron flow having passed through the pinned layer 103 has a spin parallel with the magnetization direction of it. The electron flow mainly contributes to a torque acting on the magnetization of the free layer 101. The remaining electron flow has a spin antiparallel with the magnetization direction of the pinned layer 103.

On the other hand, an electron flow is carried from the free layer 101 toward the pinned layer 103 in order to turn around the magnetization direction of the free layer 101 from parallel state with that of the pinned layer 103 to antiparallel state with that of the pinned layer 13. The electron flow passes through the free layer 101. Then, most of the electrons having a spin antiparallel with the magnetization direction of the pinned layer 103 are reflected by the pinned layer 103 and returned to the free layer 101. The electron again flows to the free layer 101, and electrons having a spin antiparallel with the magnetization direction of the pinned layer 103 mainly contribute to a torque acting on the magnetization of the free layer 101. Part of electrons having passed through the free layer 101 and having a spin antiparallel with the magnetization direction of the pinned layer 103 pass through the pinned layer 103 although they are few.

Co, Fe Ni or alloy containing those, for example, can be used as the ferromagnetic material used for the free layer 101 and the pinned layer 103. Fe—Mn, Pt—Mn, Pt—Cr—Mn, Ni—Mn, Pd—Mn, NiO, Fe2O3 and magnetic semiconductors can be used as the antiferromagnetic layer 104.

When nonmagnetic metal is used as the intermediate layer 102, any of Au, Cu, Cr, Zn, Ga, Nb, Mo, Ru, Pd, Ag, Hf, Ta, W, Pt and Bi or alloy containing any one more of those can be used. When the intermediate layer 102 is used to function as a tunnel barrier layer, Al2O3, SiO2, MgO and AlN can be used.

As shown in FIG. 1, two interconnects 11 and 12 extend adjacent to each other along the horizontal direction. The interconnects 11 and 12 form an interconnect pair. Several interconnect pairs are provided along the vertical direction on the paper of FIG. 1.

Memory cells 1 are connected between the interconnects 11 and 12 forming the interconnect pair. The memory cell 1 has one end on the side of the magnetoresistance effect element 3 connected to the interconnect 11. The memory cell 1 has the other end on the side of the select transistor 4 connected to the interconnect 12. Therefore, in order to select one memory cell, a pair of interconnect pair must be specified.

The gate electrode of the select transistor 4 is connected to a gate electrode of another select transistor 4 connected to another interconnect pair via a select line 13. The select line 13 is connected to a row decoder 18. The row decoder 18 is supplied with an address signal to activate the select line 13 in accordance with the address signal to select a row specified by the address signal.

One end of each interconnect 11 is connected to a common line 15 via a pass transistor 14. One terminal of each interconnect 12 is connected to a common line 17 via a pass transistor 16.

Each gate of the pass transistors 14 and 16 is connected to a column decoder 21. The column decoder 21 is supplied with an address signal. As mentioned, a pair of the interconnect pairs must be specified in order to select one column. Thus, when the column corresponding to the address signal is selected, the column decoder 21 turns on pass transistors 14 and 16 connected to the paired interconnects 11 and 12.

The common lines 15 and 17 are connected to a current source/sink 22. The current source/sink 22 is supplied with a control signal, and supplies a current to one of the common lines 15 and 17 in accordance with the control signal while drawing the current from the other thereof.

Figure 3:
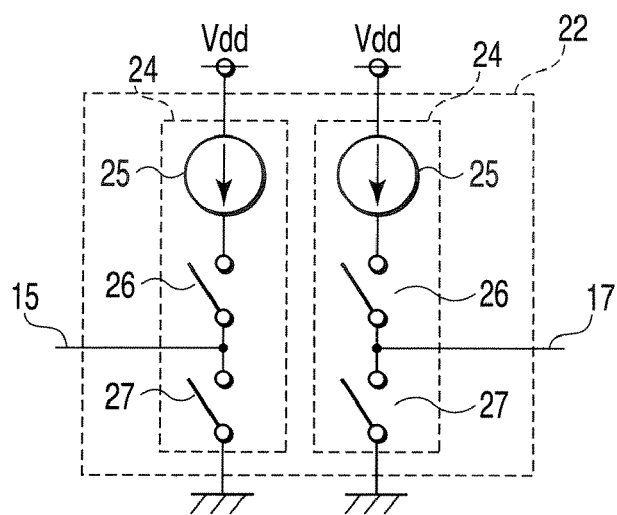
FIG. 3 shows a block diagram of a current source/sink circuit.

The current source/sink 22 has a configuration shown in FIG. 3. As seen from FIG. 3, a current source/sink 24 is connected to each of the common lines 15 and 17. The current source/sink 24 is composed of constant current source 25 connected in series between power supply voltage terminal and ground terminal, and switch circuits 26 and 27 such as transistor. The connection nodes of the switch circuits 26 and 27 are connected to the common lines 15 and 17, respectively.

When the current source/sink 24 functions as a current source, the switch circuit 26 is turned on by the control signal. On the other hand, when the current source/sink 24 functions as a current sink, the switch circuit 27 is turned on by the control signal.

As illustrated in FIG. 1, the common line 17 is connected to a readout circuit 23. The readout circuit 23 may be connected to the common line 15. The readout circuit 23 includes a sense amplifier circuit and so on.

In a write operation, one current path is formed by the paired turned-on pass transistors 14, 16, and the select transistor 4 connected to one row select line 13 activated in accordance with the address signal. The magnetoresistance effect element 3 (selected magnetoresistance effect element) in the current path is supplied with a write current. By doing so, data is written to the selected magnetoresistance effect element 3.

Which one of the common lines 15 and 17 is connected to the current source circuit and to the current sink circuit is decided by the write data.

In a readout operation, the magnetoresistance effect element 3 specified like the write operation is supplied with a readout current small enough to avoid magnetization switching. The readout circuit 23 compares a current or voltage value which depends on the resistance state of the magnetoresistance effect element 3 with a reference value to determine the resistance state.

Figure 4:
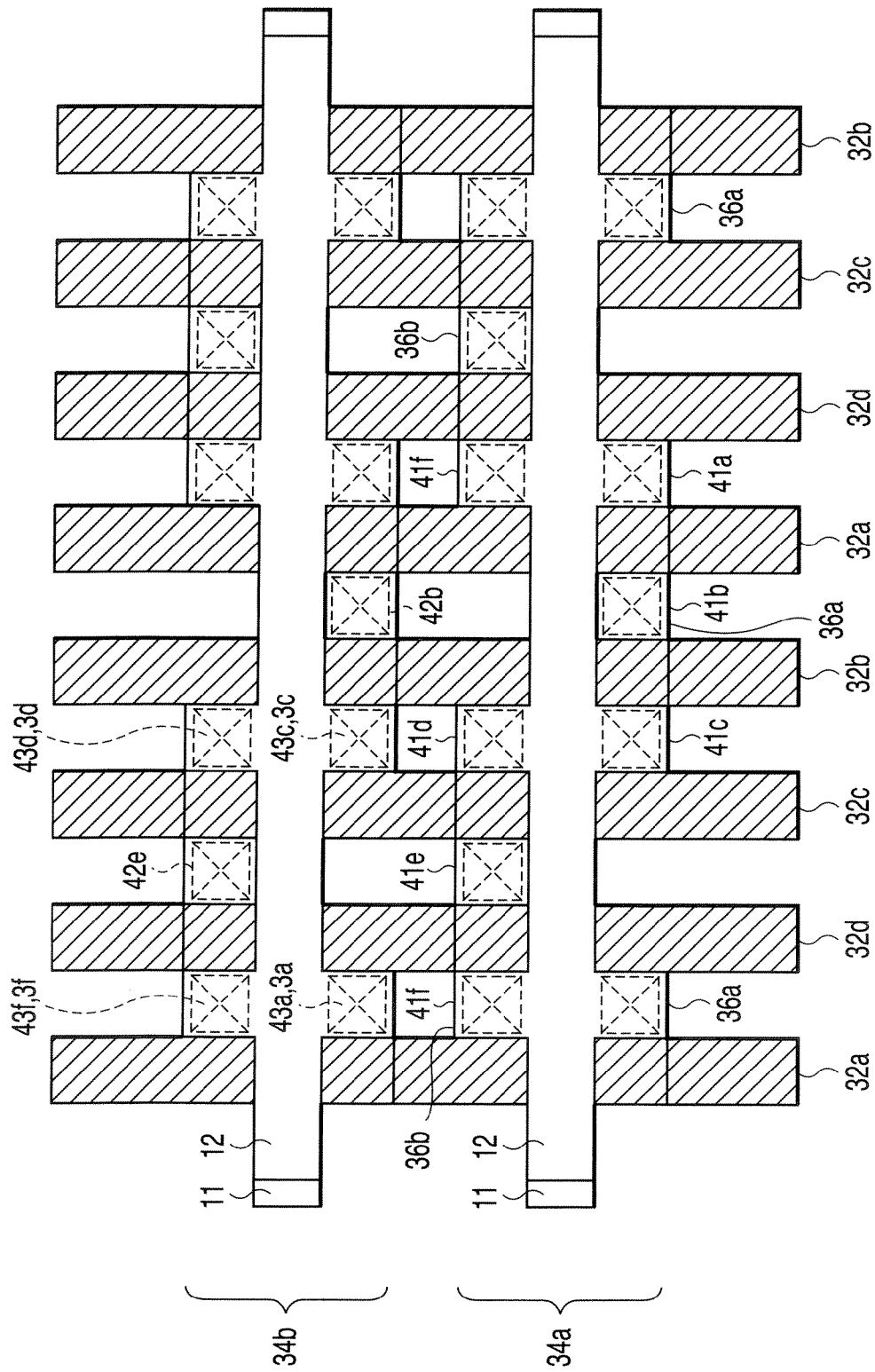
FIG. 4 shows a top plan view of a memory cell array according to the first embodiment.
Figure 5:
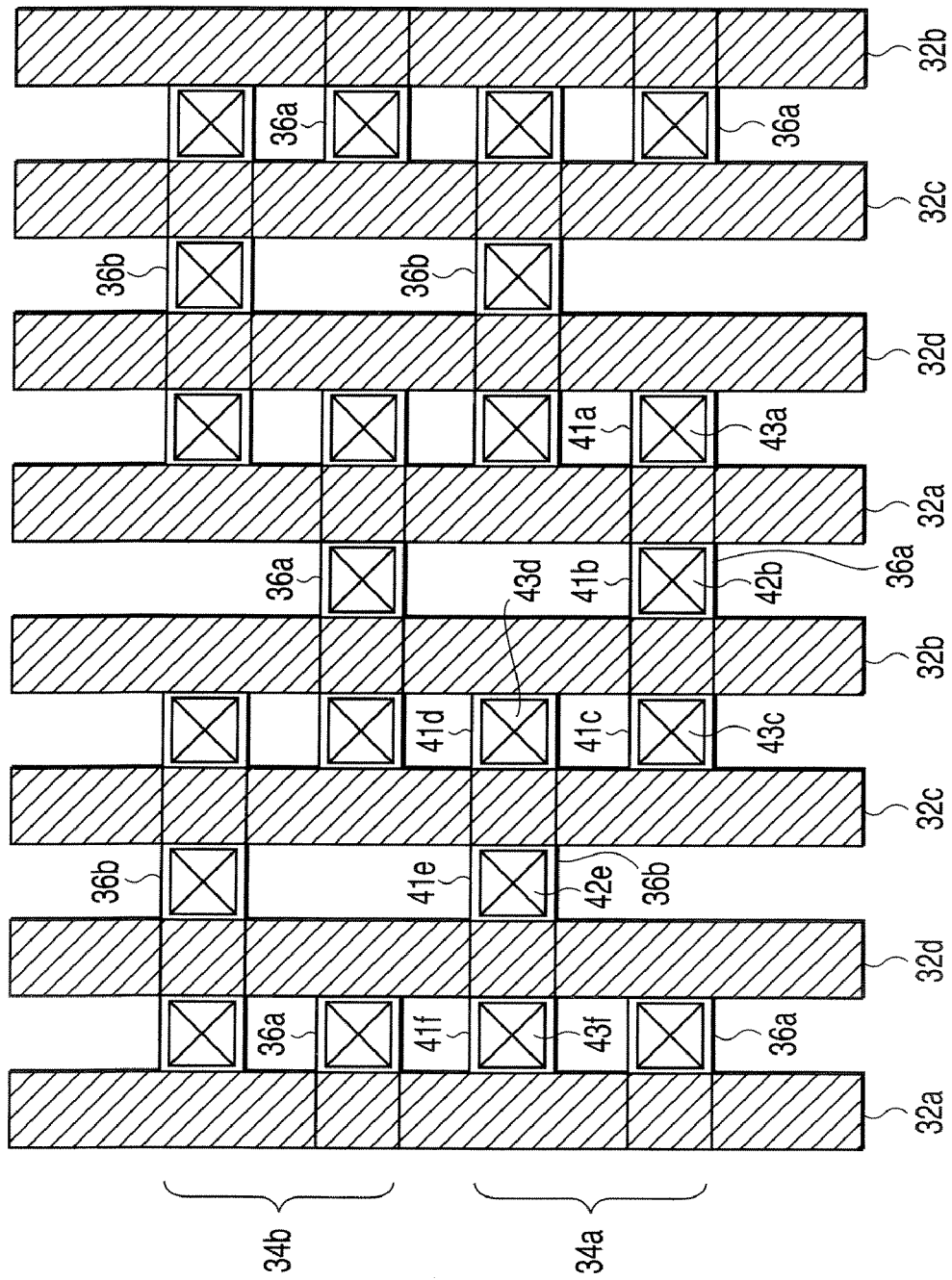
FIG. 5 to FIG. 7 show top plan views of part of the memory cell array according to the first embodiment.
Figure 6:
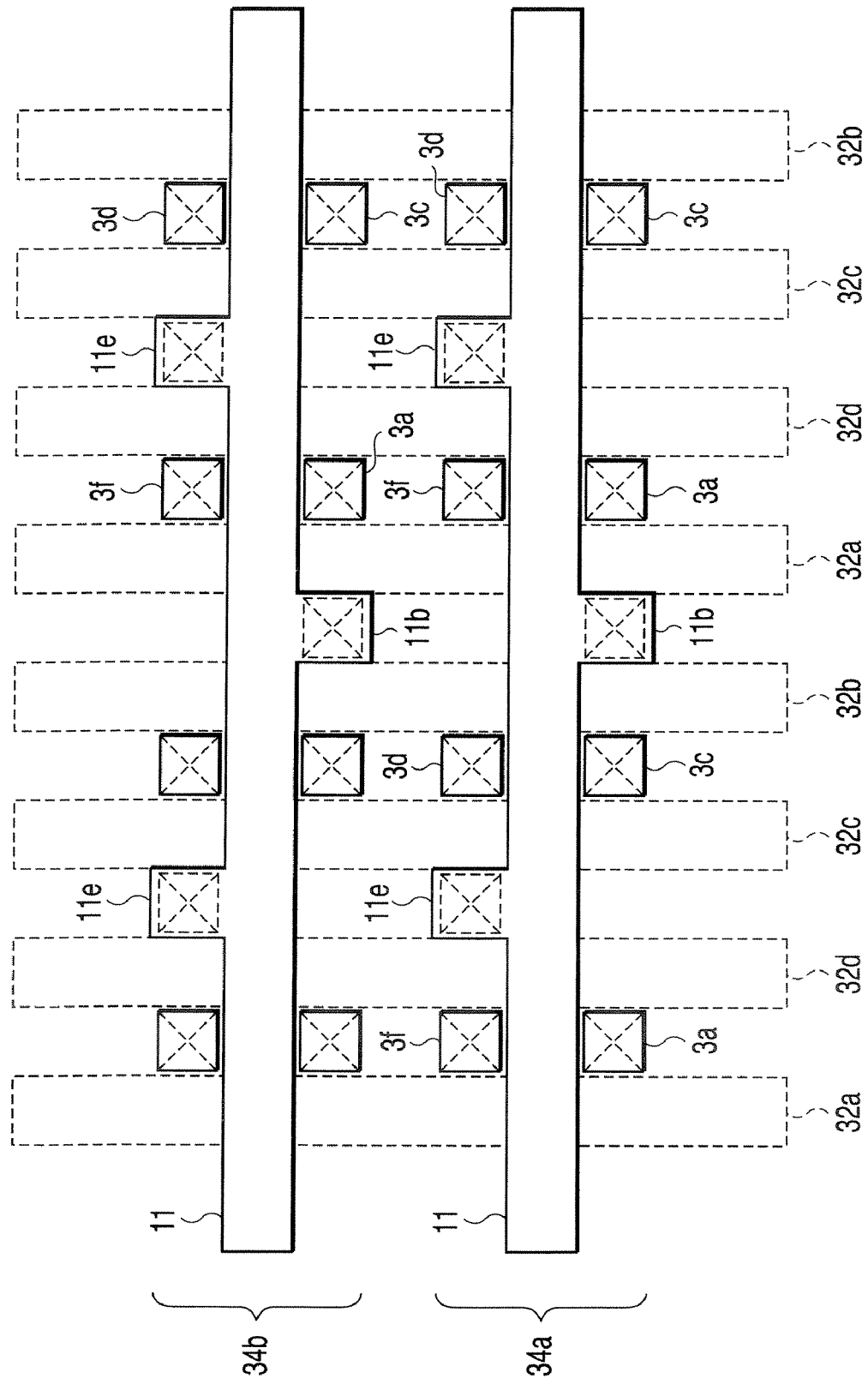
Figure 7:
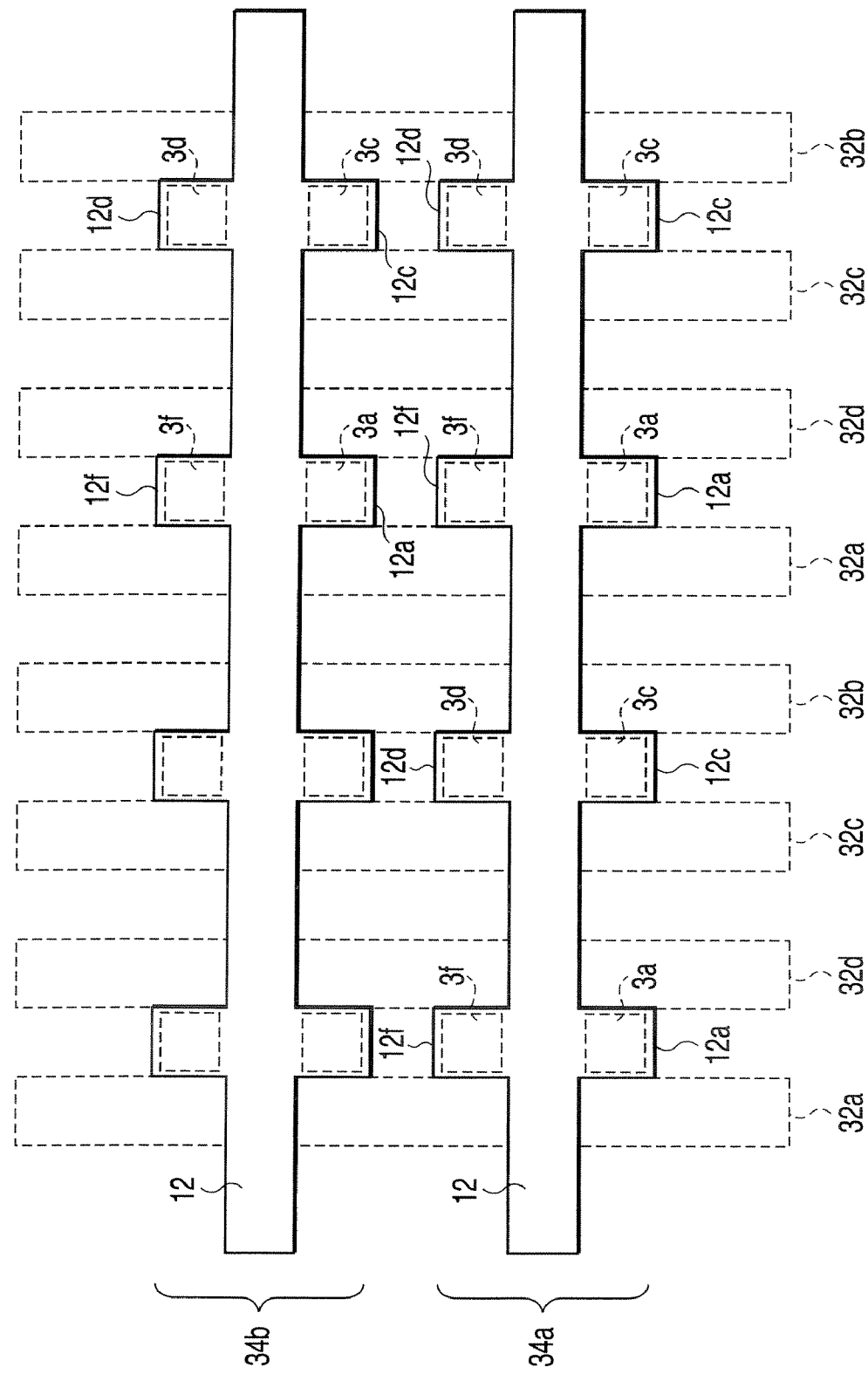
Figure 8:
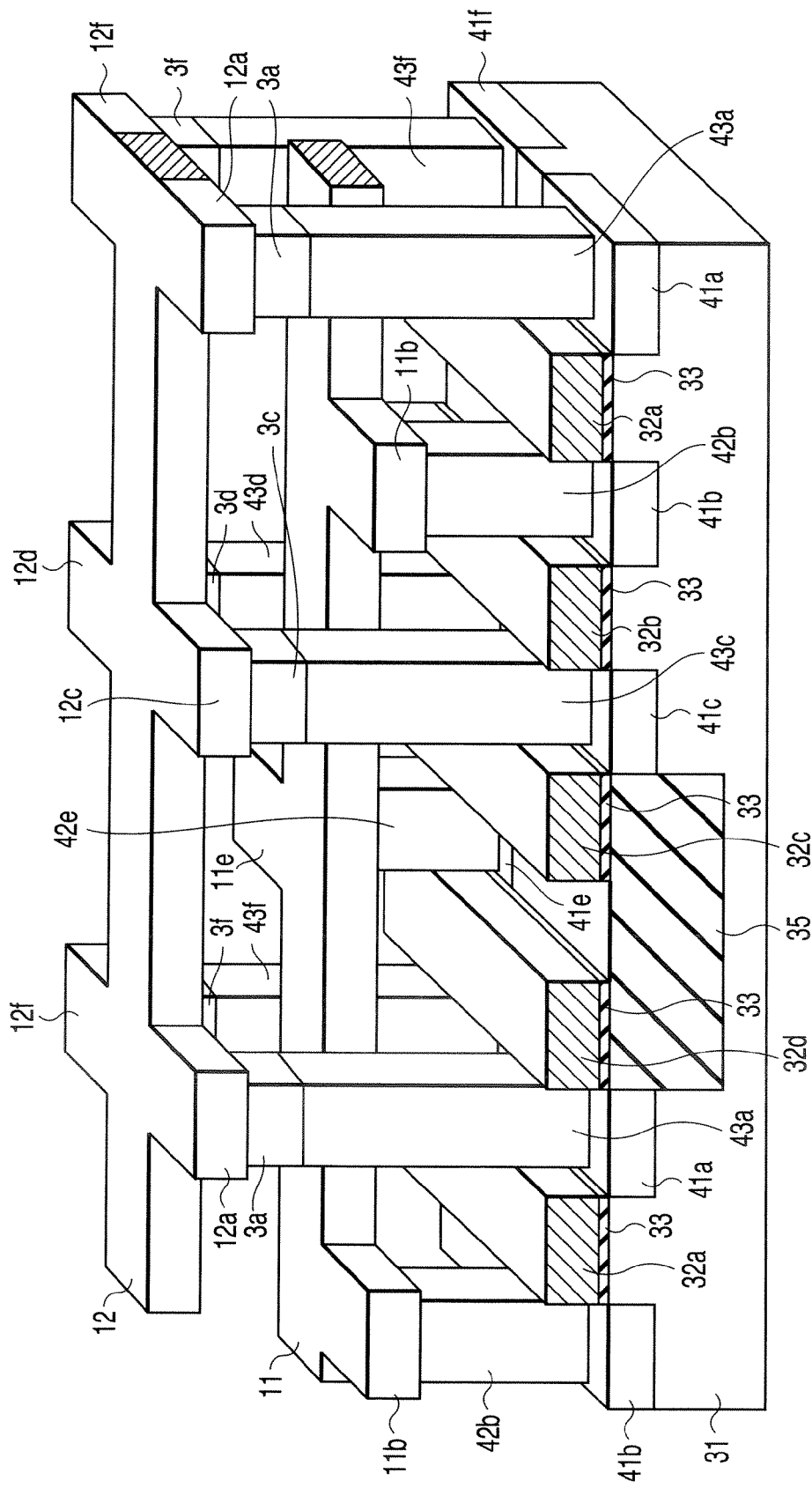
FIG. 8 shows a perspective view of the memory cell array according to the first embodiment.

The structure of the magnetic memory device according to the first embodiment will be descried below with reference to FIG. 4 to FIG. 8. FIG. 4 shows a top plan view of the memory cell array of the first embodiment. FIG. 5 shows a top plan view of a semiconductor device between a substrate and a plug. FIG. 6 shows a top plan view between an interconnect at the first level and magnetoresistance effect elements. FIG. 7 shows a top plan view up to an interconnect at the second level. FIG. 8 shows a perspective view of the memory cell array of the first embodiment.

As shown in FIG. 4 to FIG. 8, gate electrodes 32a to 32d (referred to as gate electrode 32 when separate designation is unnecessary) are provided above the surface of a semiconductor substrate 31. Each gate electrode 32 is provided on a gate insulating film 33 which lies on the surface of a semiconductor substrate 31. Gate electrodes 32a to 32d are arrayed at intervals each other along the vertical direction of FIG. 4 to FIG. 7. Gate electrodes 32a to 32d constitute one unit, and several units are periodically provided along the horizontal direction of the drawings.

As seen from the drawings, more than one unit basic structures are provided along the horizontal direction. FIG. 4 to FIG. 7 each shows part of the unit basic structures 34a and 34b (referred to as unit basic structure 34 when separate designation is unnecessary). FIG. 8 shows part of the unit basic structure 34.

Each unit basic structure 34 has the same structure. Each unit basic structure 34 includes element regions 36a, 36b, source/drain diffusion area 41a to 41f, plugs 42a, 42e, 43a, 43c, 43d, 43f, interconnects 11 and 12.

An element region 36a defined by an isolation insulating film 35 is formed from the region between gate electrodes 32d, 32a to the region between gate electrodes 32b, 32c. An element region 36b defined by the isolation insulating film 35 is formed from the region between gate electrodes 32b, 32c to the region between gate electrodes 32d, 32a. Hereinafter, the element regions 36a and 36b are referred to as element region 36 when separate designation is unnecessary.

The element regions 36a and 36b are mutually separated in the vertical direction of the drawings. The upper side of the element region 36a faces one element region 36b between gate electrodes 36b and 36c. The upper side of the element region 36a faces another element region 36b between gate electrodes 36d and 36a. A pair of element regions 36a and 36b thus arranged is used as one unit, and more than one units are periodically provided along the horizontal direction of the drawings. A group of element regions 36a and 36b provided according to the arrangement rule belongs to one unit basic structure 34.

The lower side of the element region 36a faces an element region 36b belonging to another unit basic structure 34 between gate electrodes 32b and 32c. The lower side of the element region 36a faces an element region 36b belonging to another unit basic structure 34 between gate electrodes 32d and 32a.

Source/drain diffusion areas 41a to 41c are respectively provided between gate electrodes 32d and 32a, between gate electrodes 32a and 32b and between electrodes gate electrodes 32b and 32c on the surface of the semiconductor substrate in the element region 36a.

Source/drain diffusion areas 41d to 41f are respectively provided between gate electrodes 32b and 32c, between gate electrodes 32c and 32d and between electrodes gate electrodes 32d and 32a on the surface of the semiconductor substrate in the element region 36b. The gate electrodes 32 and a pair of source/drain diffusion areas 41 on both side of it form the select transistors 4.

Plugs 42b and 42e are formed on the source/drain diffusion areas 41b and 41e, respectively. The interconnect 11 is provided above the semiconductor substrate 31. The interconnect 11 has a straight part extending a region between plugs 41a and 41f and a region between plugs 41c and 41d, and projected parts 11b and 11e. The projected parts 11b and 11e are positioned above plugs 42b and 42e, and connected to the upper surfaces of the plugs 42b and 42e, respectively.

Plugs 43a, 43c, 43d and 43f are respectively formed on source/drain diffusion areas 41a, 41c, 41d and 41f, and connected to them. Magneto-resistance effect elements 3a, 3c, 3d and 3f are respectively provided on plugs 43a, 43c, 43d and 43f, and connected to them.

The interconnect 12 lies above, typically right above the interconnect 11, along the interconnect 11. The interconnect 12 has a straight part above the interconnect 11, projected parts 12a, 12c, 12d and 12f. The projected parts 12a, 12c, 12d and 12f lie above magnetoresistance effect elements 3a, 3c, 3d and 3f, contact with the upper surface of these elements 3a, 3c, 3d and 3f, respectively.

More than one unit basic structures 34 as mentioned are arrayed in the extending direction of the gate electrode 32, and thereby, the memory cell array 2 is formed.

Figure 9:
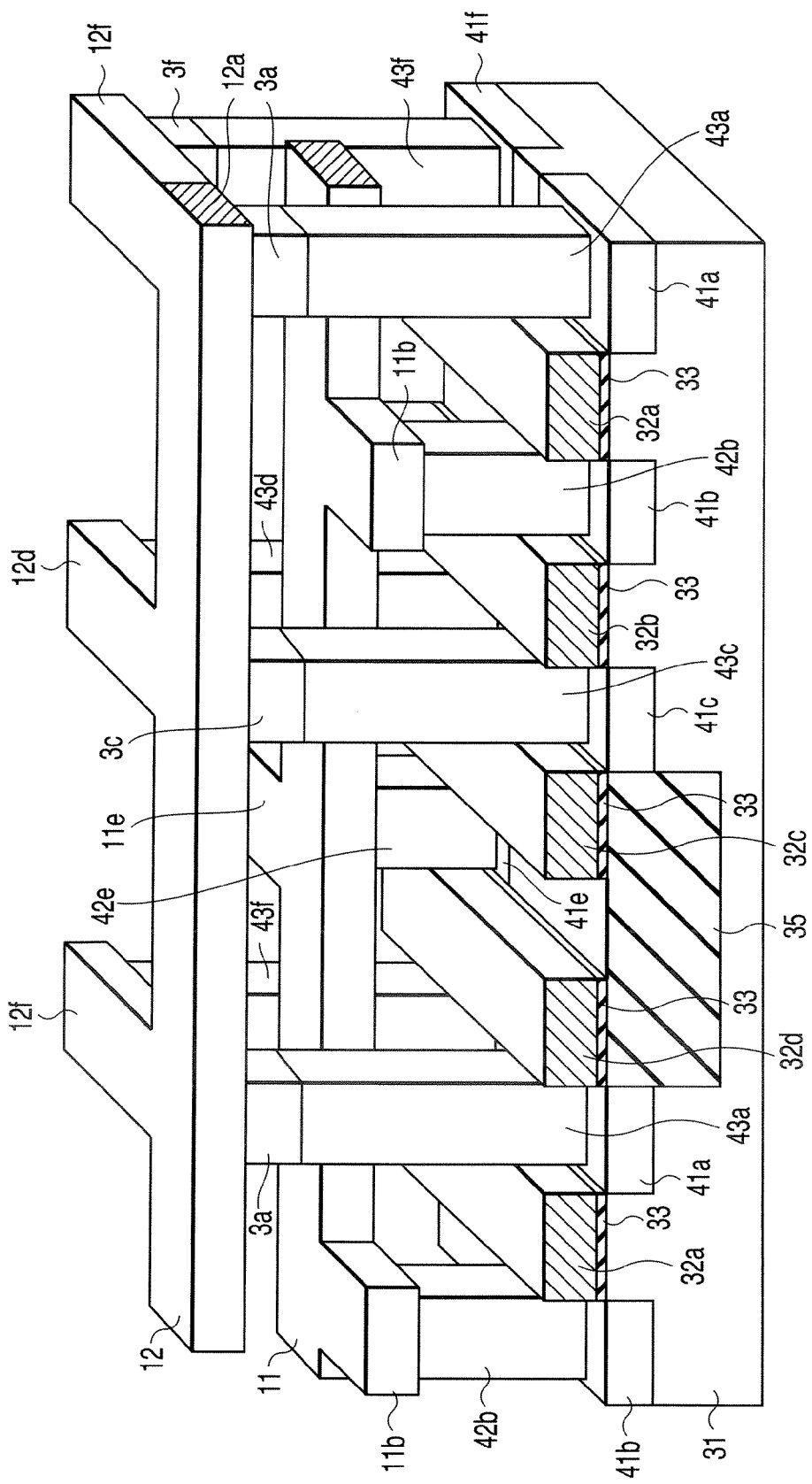
FIG. 9 shows a perspective view of a memory cell array according to a first modification of the first embodiment.

The memory cell array may also have a structure shown in FIG. 9. FIG. 9 shows a perspective view of a memory cell array according to a first modification of the first embodiment. As shown in FIG. 9, an interconnect 12 has a straight part extending above magnetoresistance effect elements 3a and 3c, projected parts 12d and 12f respectively overlying magnetoresistance effect elements 3d and 3f. The interconnect 12 may also have a straight part extending above magnetoresistance effect elements 3d and 3f, projected parts 12d and 12f overlying magnetoresistance effect elements 3a and 3c.

Figure 10:
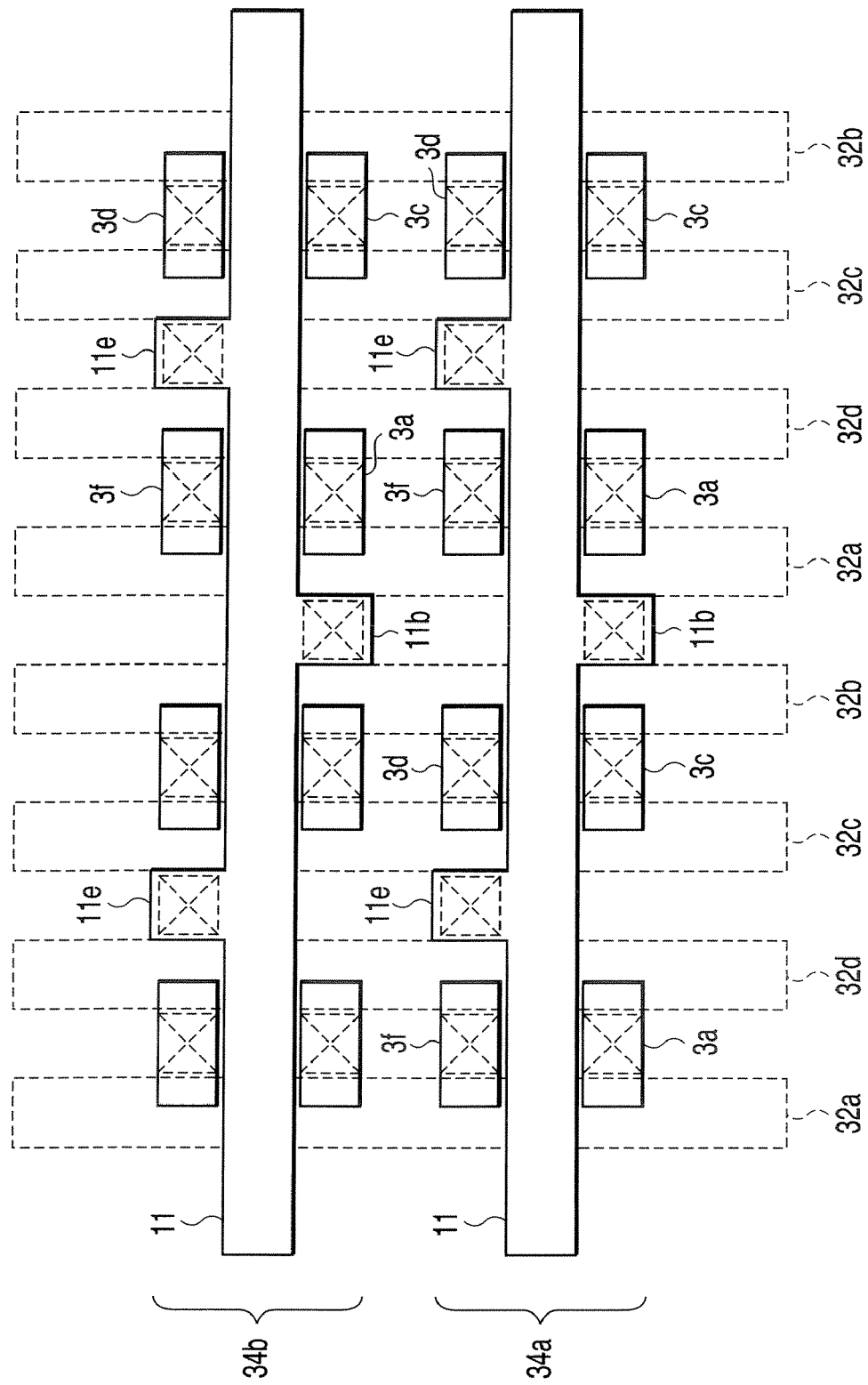
FIG. 10 and FIG. 11 show top plan views of part of a memory cell array according to a second modification of the first embodiment.
Figure 11:
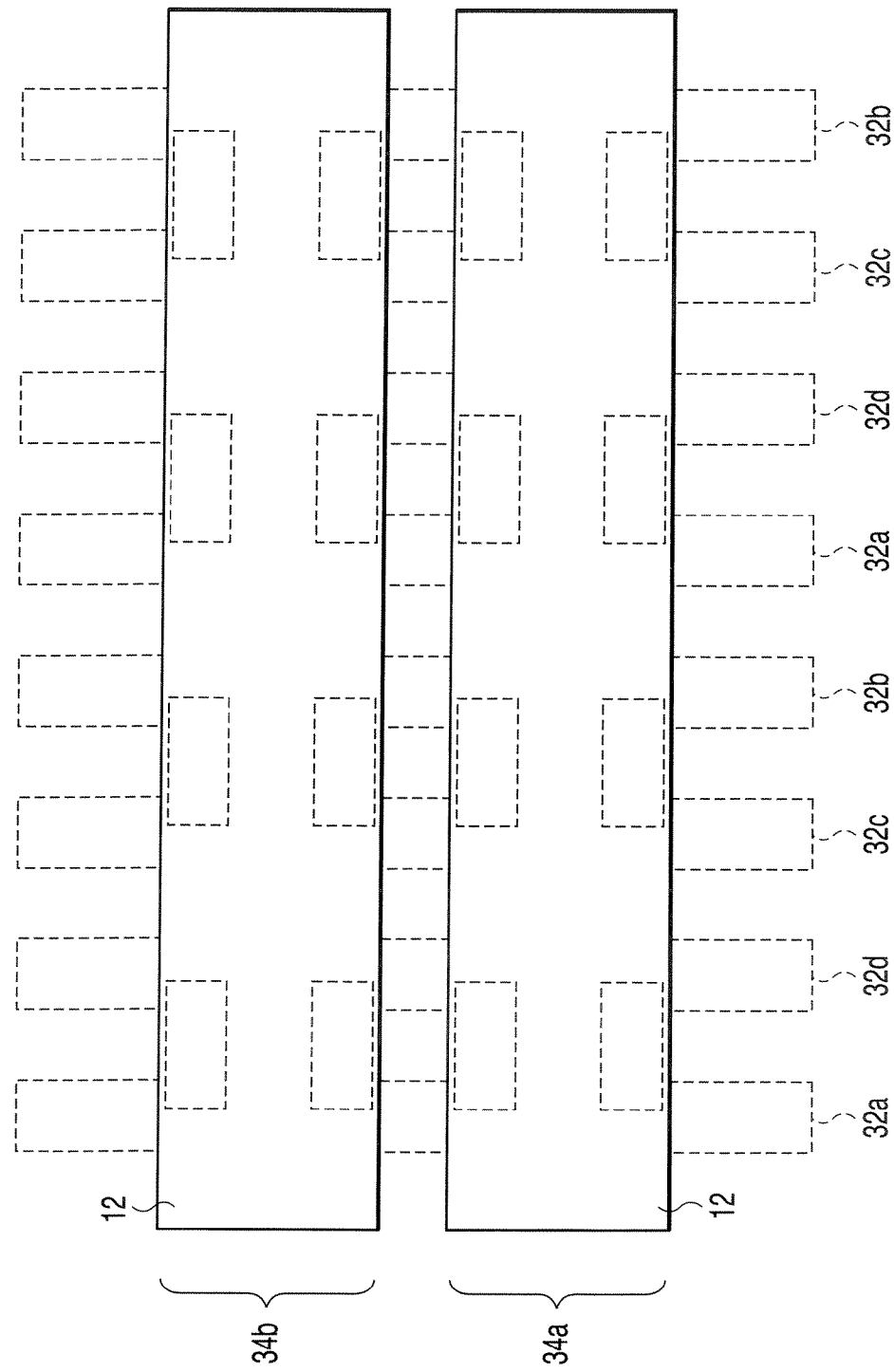
Figure 12:
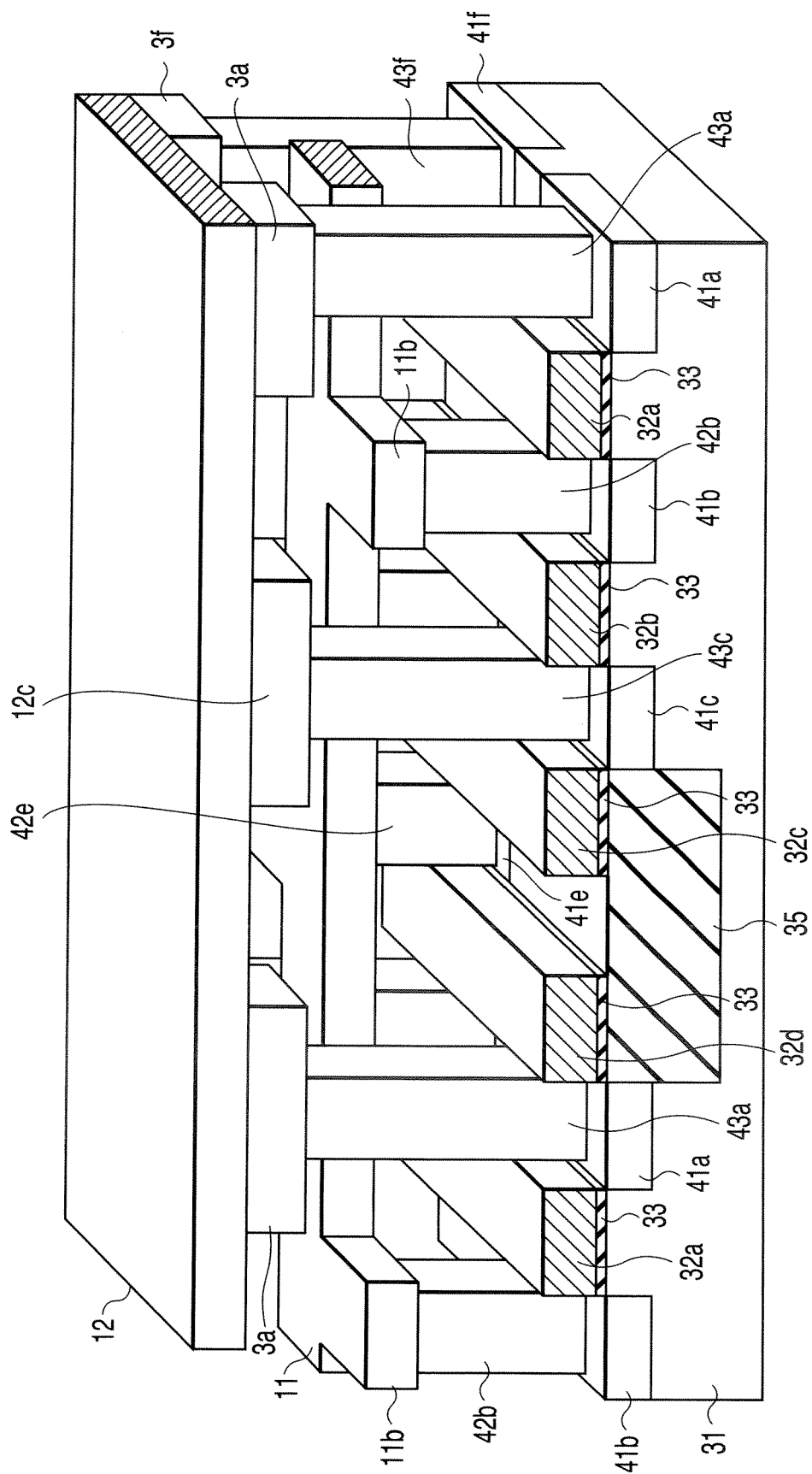
FIG. 12 shows a perspective view of the memory cell array according to the second modification of the first embodiment.

The memory cell array may also have a structure shown in FIG. 10 to FIG. 12. FIG. 10 shows a top plan view up to an interconnect at the first level and magnetoresistance effect element of a memory cell array according to a second modification of the first embodiment. FIG. 11 shows a top plan view up to a interconnect of the memory cell array according to a second modification of the first embodiment. FIG. 12 shows a perspective view of the memory cell array according to the second modification of the first embodiment. The positional structure corresponding to FIG. 8 remains the same as the first embodiment.

As illustrated as FIG. 10 to FIG. 12, a magnetoresistance effect element 3 has a width larger than a plug 43. The interconnect 12 covers all magnetoresistance effect elements 3 of unit basic structures 34a and 34b to which the interconnect 12 belongs and regions between these elements 3. As described above, the interconnect 12 is widened in its width, thereby reducing a resistance value of the interconnect 12.

Figure 13:
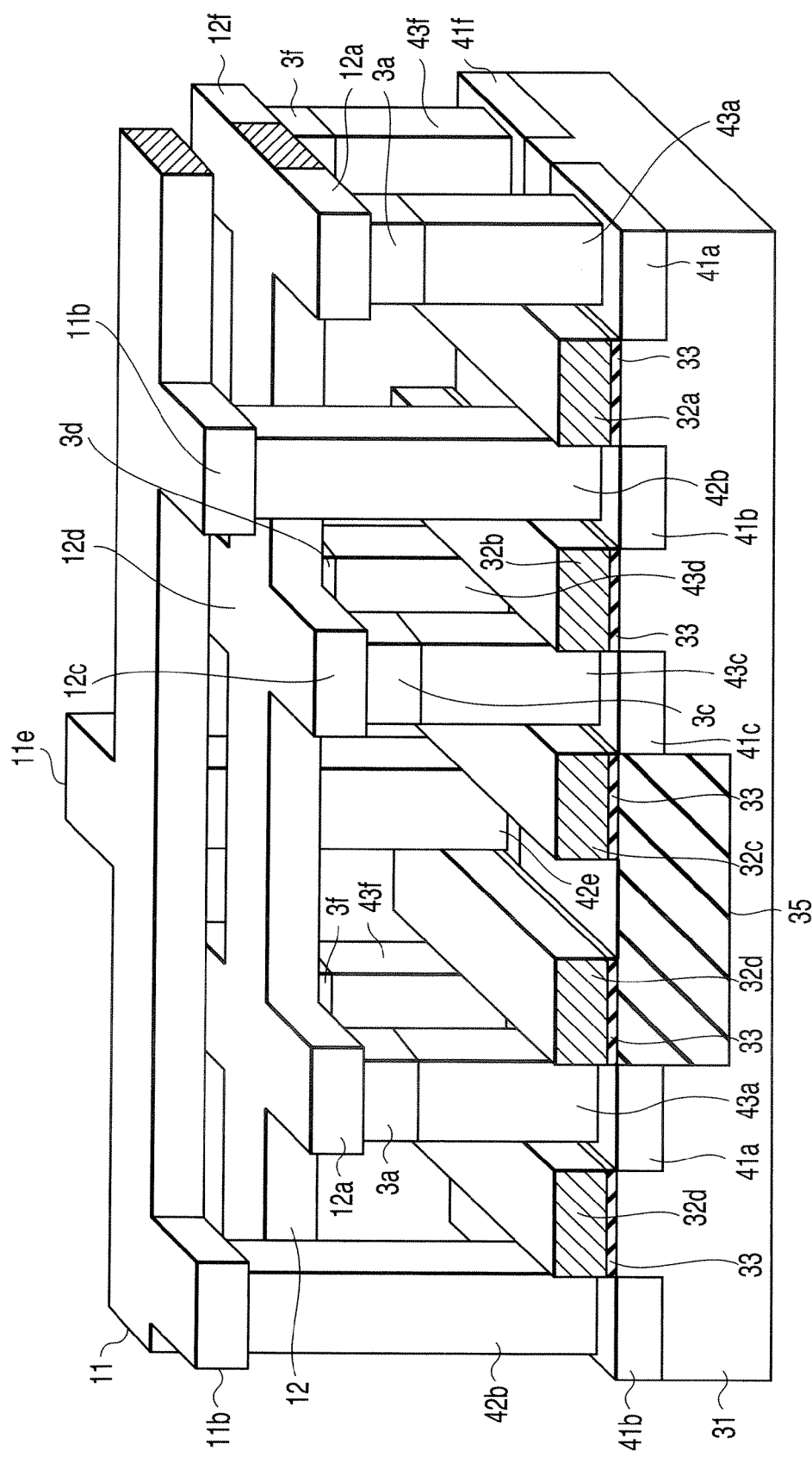
FIG. 13 shows a perspective view of a memory cell array according to a third modification of the first embodiment.

The memory cell array may also have a structure shown in FIG. 13. FIG. 13 shows a perspective view of memory cell array according to a third modification of the first embodiment. As depicted in FIG. 13, the interconnect 12 is interposed between a semiconductor substrate 31 and the interconnect 11. For the structure, a plug 42 is higher than a plug 43.

Figure 24:
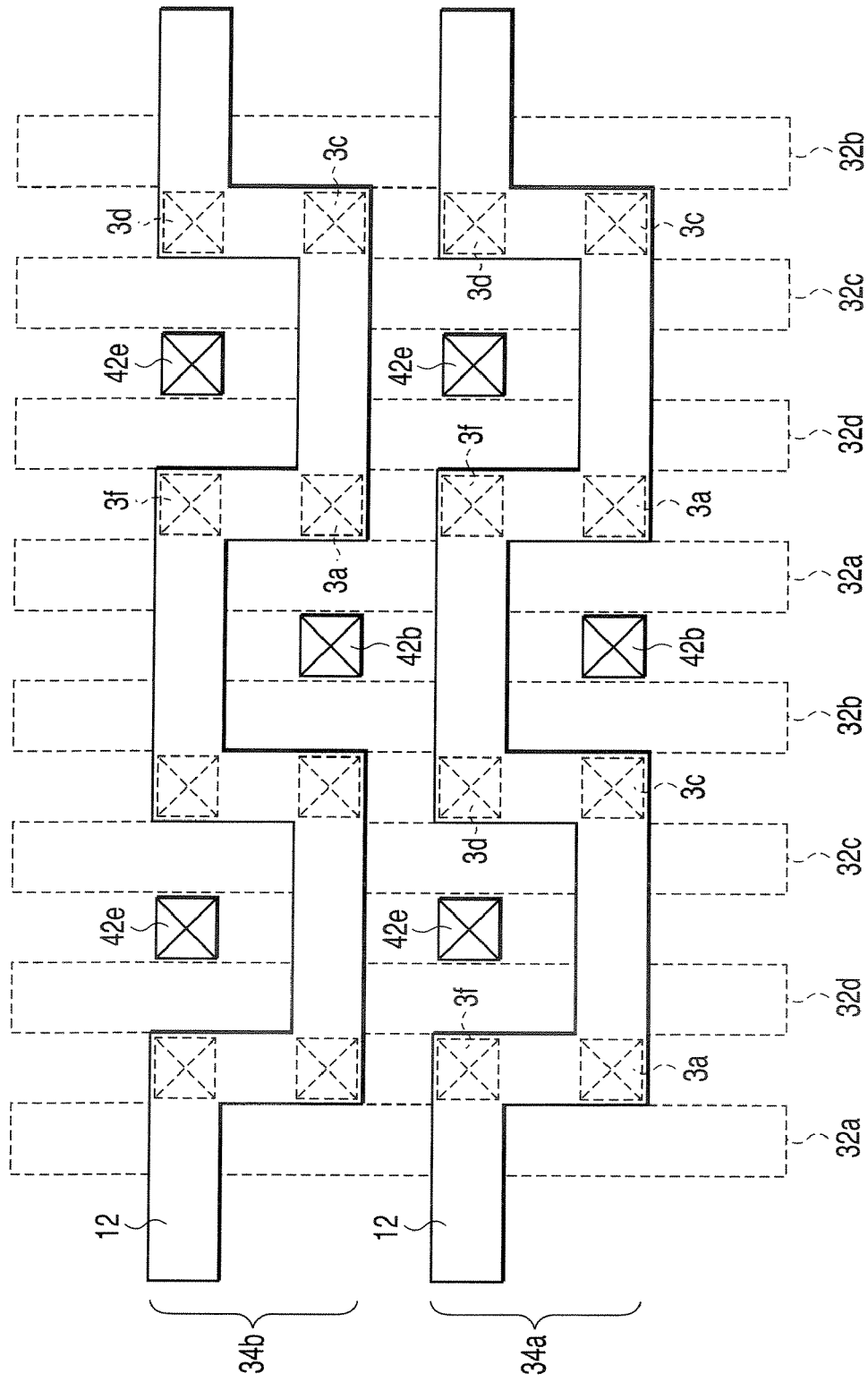
FIG. 24 and FIG. 25 shows top plan views of part of a memory cell array according to a fourth modification of the first embodiment.
Figure 25:
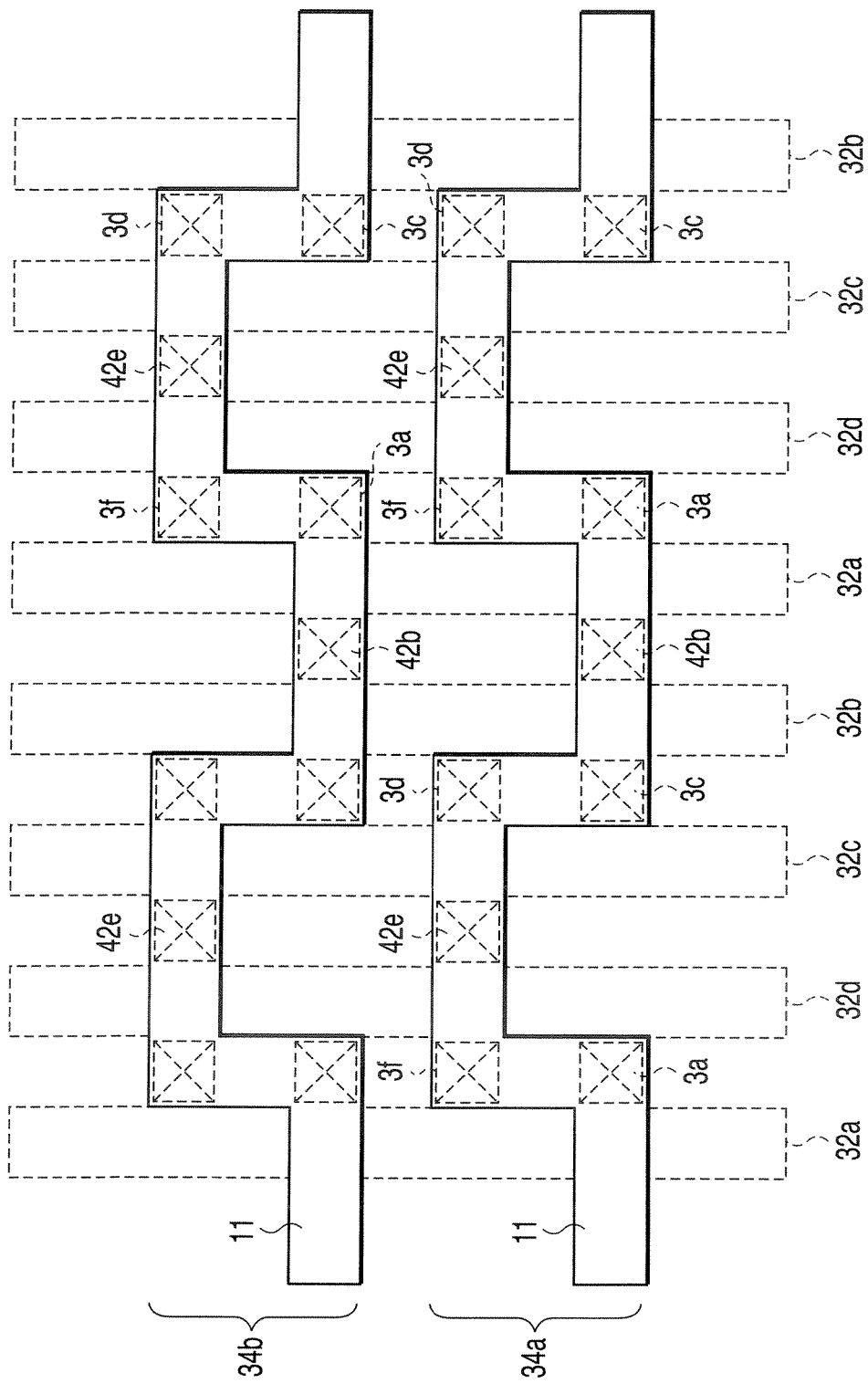
Figure 26:
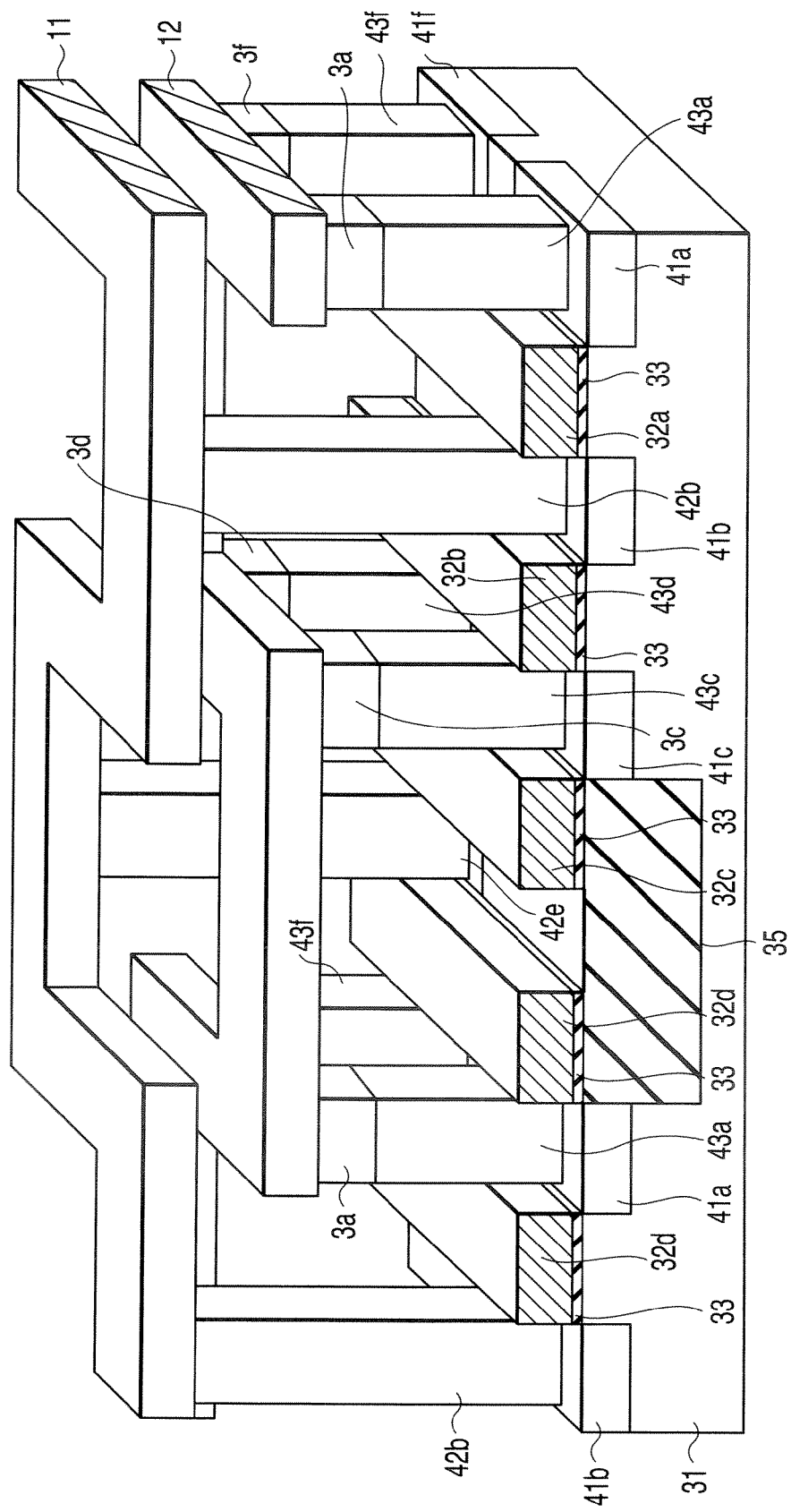
FIG. 26 shows a perspective view of the memory cell array according to the fourth modification of the first embodiment; and FIG. 27 to FIG. 29 shows a top plan view of another memory cell array of the third embodiment.

The memory cell array may also have a structure shown in FIG. 24 to FIG. 26. FIG. 24 shows a top plan view from a semiconductor substrate up to an interconnect at the first level and magnetoresistance effect element of a memory cell array according to a fourth modification of the first embodiment.

FIG. 25 shows a top plan view up to an interconnect at the second level. FIG. 26 shows a perspective view of the memory cell array according to the fourth modification of the first embodiment. The fourth modification has the same structure from the semiconductor substrate to plugs as FIG. 4. An interconnect 12 is interposed between the semiconductor substrate 31 and the interconnect 11 in the fourth modification, like the third modification.

As seen from FIG. 24 and FIG. 26, the interconnect 12 has a line shape which lies to cover the magnetoresistance effect elements 3 and bent to avoid plugs 42. Specifically, the interconnect 12 extends along the gate electrode 32 on magnetoresistance effect elements 3a and 3f and extends along the direction crossing the gate electrode 32 (typically, perpendicular direction) to overlie magnetoresistance effect elements 3f and 3d. Moreover, the interconnect 12 extends along the gate electrode 32 on magnetoresistance effect elements 3d and 3c and extends along the direction crossing the gate electrode 32 (typically, perpendicular direction) to overlie magnetoresistance effect elements 3c and 3a.

As seen from FIG. 25 and FIG. 26, the interconnect 11 has a line which lies to cover the plugs 42 and magnetoresistance effect elements 3. Specifically, the interconnect 11 extends along the direction crossing the gate electrode 32 (typically, perpendicular direction) above the magnetoresistance effect elements 3a and 3c and on the plug 42b. The interconnect 11 extends along the gate electrode 32 above magnetoresistance effect elements 3c and 3d. The interconnect 11 extends along the direction crossing the gate electrode 32 (typically, perpendicular direction) above the magnetoresistance effect elements 3d and 3f and on the plug 42e. The interconnect 11 extends along the gate electrode 32 above magnetoresistance effect elements 3f and 3a.

In the magnetic memory device according to the first embodiment, the distance between interconnects 11 and between interconnects 12 are wide as seen from FIG. 4. In a typical structure to realize spin injection write method, which requires two type interconnects, each first interconnect lies right above horizontally-aligned ones of matrix-arrayed magnetoresistance effect elements and is connected to the corresponding ones, and each second interconnect lies below and between two first interconnects and is connected to the source/drain regions of select transistors.

However, the structure makes the pitch between adjacent two first interconnects and between the adjacent two second interconnects narrow. It is expected that the narrow pitch prevent successful placement of pass transistors when the minimum rule is employed. Solving the problem may require widening the pitches between interconnects, which prevents high integration of the magnetic memory device.

On the contrary, the first embodiment can provide wide pitches between two adjacent interconnects 11 and between two adjacent interconnects 12 and easily arrange pass transistors 14 and 16 while keeping high integration of the magnetic memory device. Therefore, the first embodiment can provide a spin injection write type magnetic memory device realizing high integration.

Second Embodiment

The second embodiment differs from the first embodiment in arrangement of the unit basic structure 34b.

Figure 14:
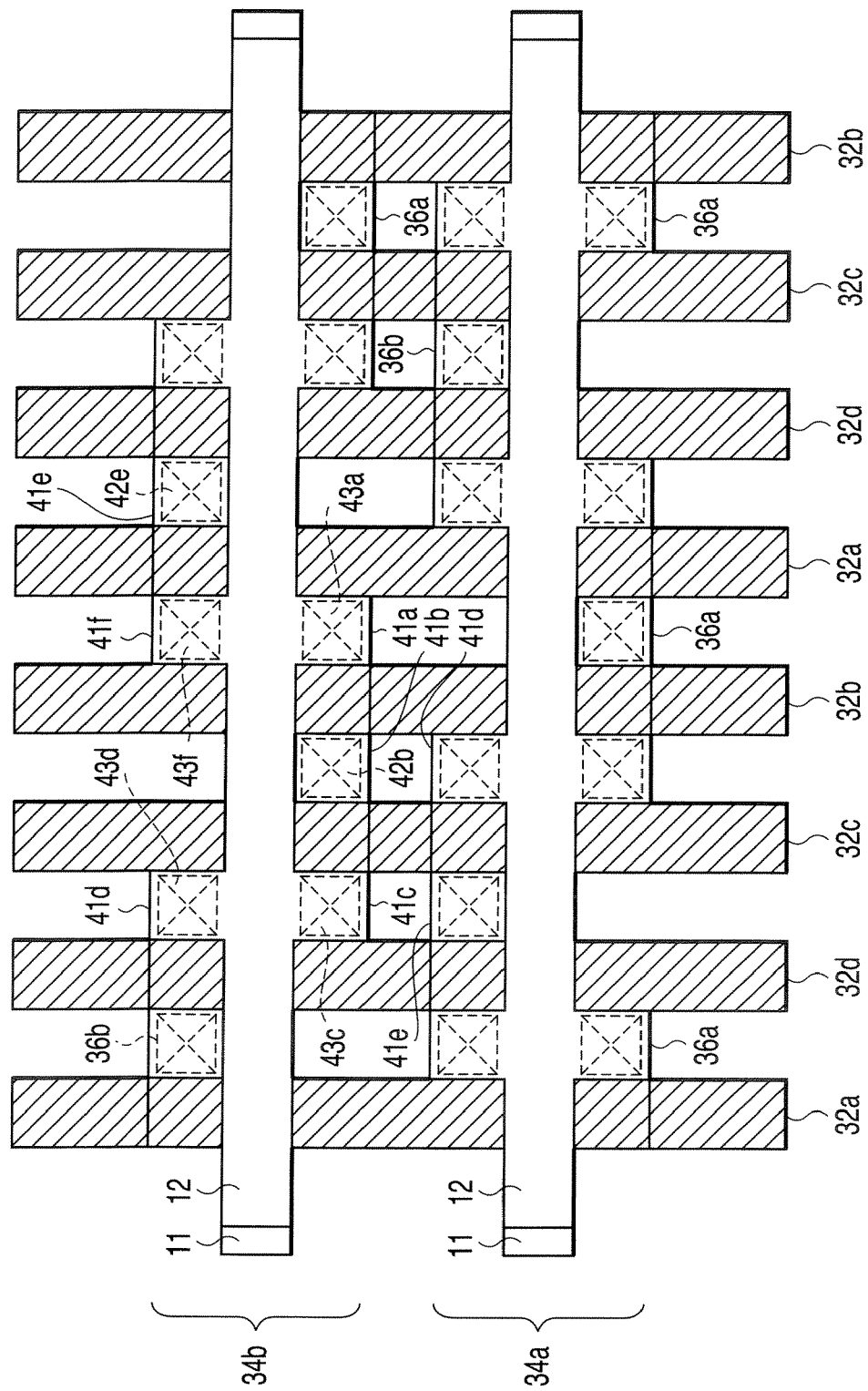
FIG. 14 shows a top plan view of the memory cell array according to a second embodiment.

FIG. 14 shows a top plan view of part of a memory cell array according to a second embodiment. As shown in FIG. 14, the structure of each feature in the unit basic structure 34b remains the same but the positional relationship between source/drain diffusion area 41 and gate electrode 32 differs from the first embodiment. In other words, position of source/ drain diffusion areas 41a to 41f of the unit basic structure 34b are shifted to inter-gate electrode area, which is area between gate electrodes 32, for one inter-gate electrode area from the first embodiment to the left.

Specifically, source/drain diffusion areas 41f and 41a are formed between gate electrodes 32a and 32b. A source/drain diffusion area 41b is formed between gate electrodes 32b and 32c. Source/drain diffusion areas 41c and 41d are formed between gate electrodes 32c and 32d. A source/drain diffusion area 41e is formed between gate electrodes 32d and 32a.

Plugs 43a, 42b, 43c, 43d, 42e and 43f, magnetoresistance effect elements 3a to 3f, projected parts 12a, 11b, 12c, 12d, 11e and 12f of interconnects 11, 12 are formed above source/ drain diffusion areas 41a to 41f, respectively, like the first embodiment. The unit basic structure 34a is the same as the first embodiment.

The second embodiment brings the same effect as the first embodiment.

Third Embodiment

The third embodiment differs from the first embodiment in arrangement of the unit basic structure 34b.

Figure 15:
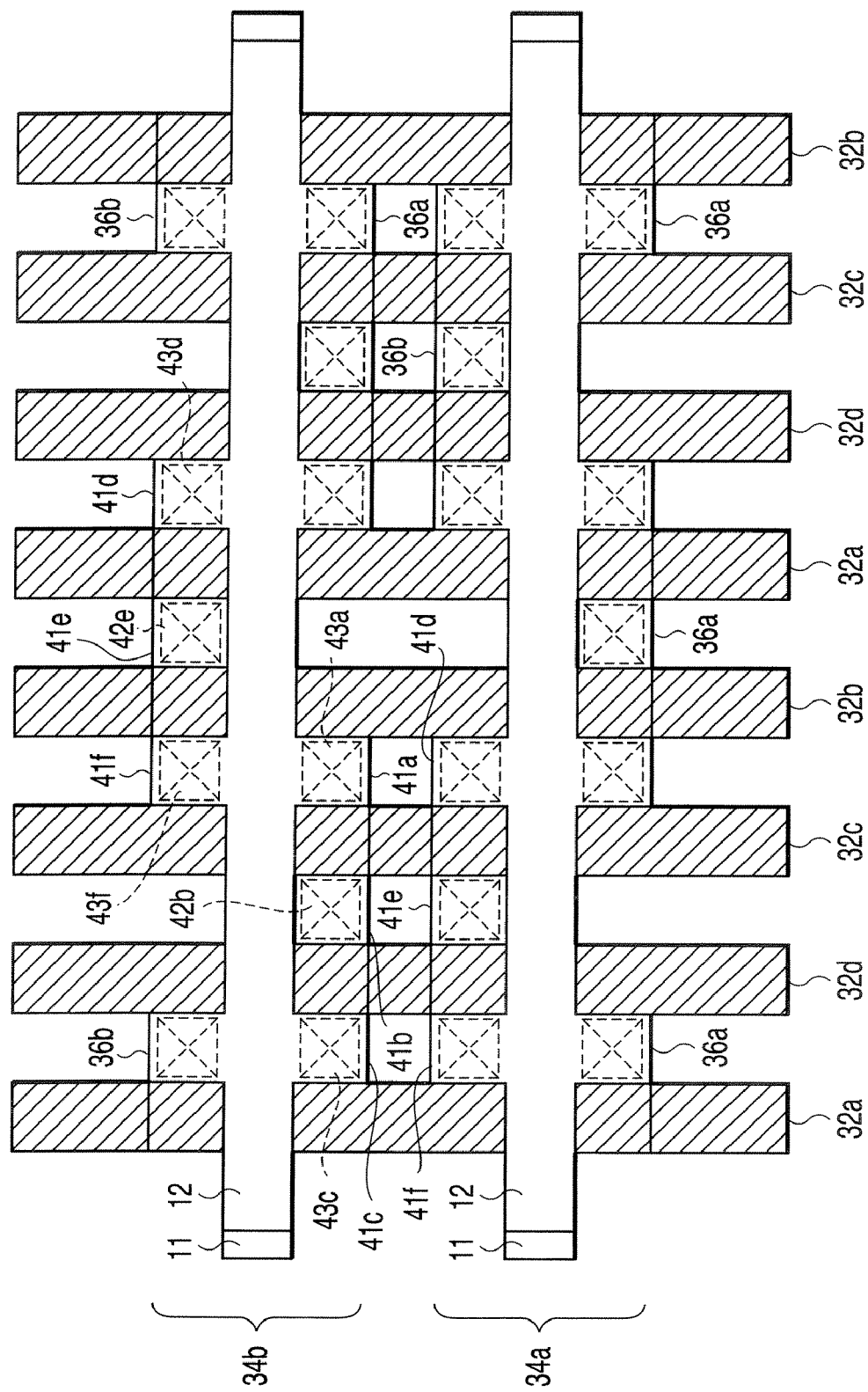
FIG. 15 shows a top plan view of the memory cell array according to a third embodiment.

FIG. 15 shows a top plan view of part of a memory cell array according to a third embodiment. As shown in FIG. 15, the structure of each feature in the unit basic structure 34b remains the same but the positional relationship between source/drain diffusion area 41 and gate electrode 32 differs from the first embodiment. In other words, position of source/ drain diffusion areas 41a to 41f of the unit basic structure 34b are shifted to inter-gate electrode area for two inter-gate electrode area from the first embodiment to the left. Therefore, unit basic structures 34b and 34a are symmetry with respect to the interconnect 11.

Specifically, source/drain diffusion areas 41f and 41a are formed between gate electrodes 32b and 32c. A source/drain diffusion area 41b is formed between gate electrodes 32c and 32d. Source/drain diffusion areas 41c and 41d are formed between gate electrodes 32d and 32a. A source/drain diffusion area 41e is formed between gate electrodes 32a and 32b.

Plugs 43a, 42b, 43c, 43d, 42e and 43f, magnetoresistance effect elements 3a to 3f, projected parts 12a, 11b, 12c, 12d, 11e and 12f of interconnects 11, 12 are formed above source/ drain diffusion areas 41a to 41f, respectively, like the first embodiment. The unit basic structure 34a is the same as the first embodiment.

Figure 27:
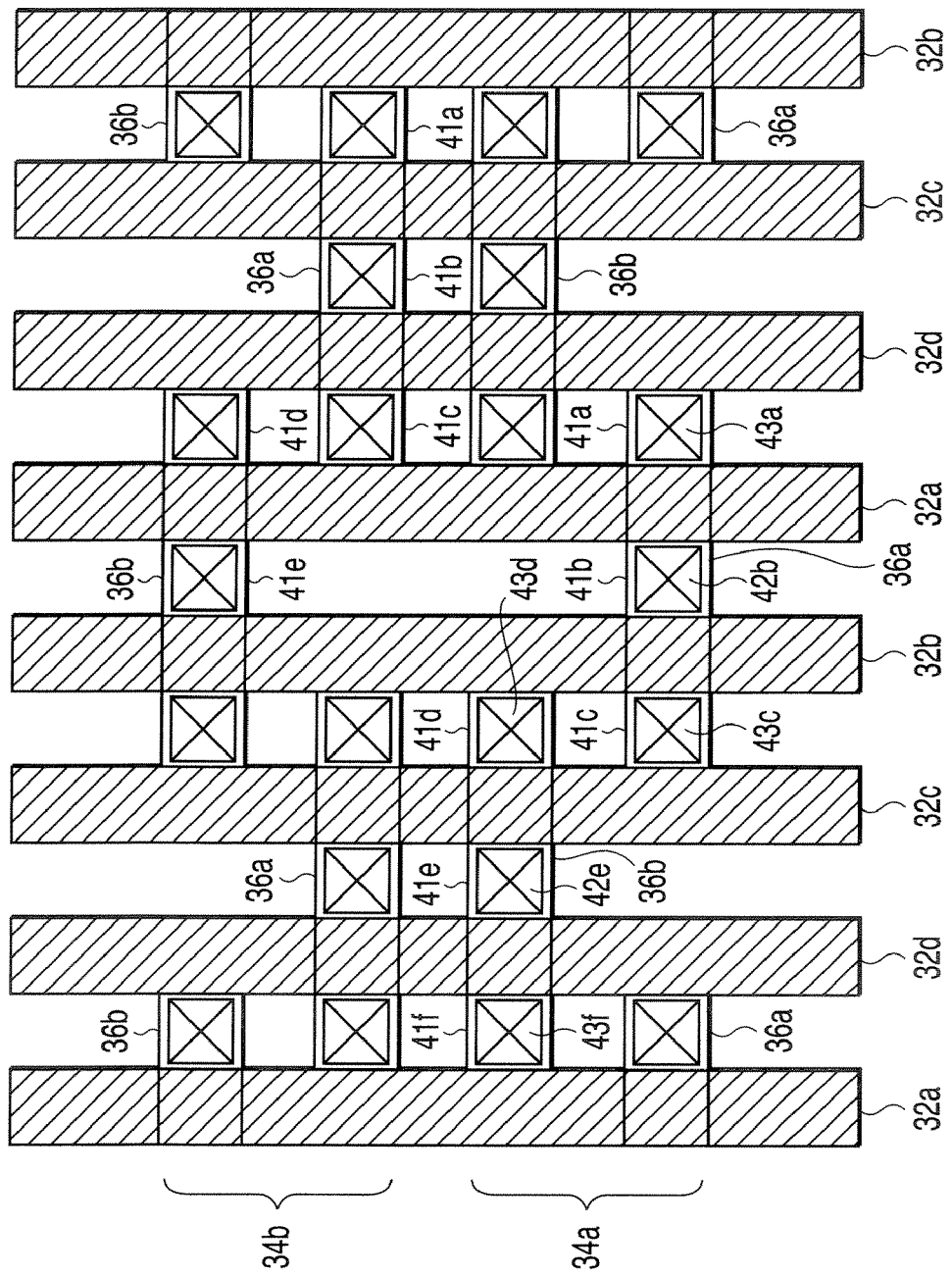
Figure 28:
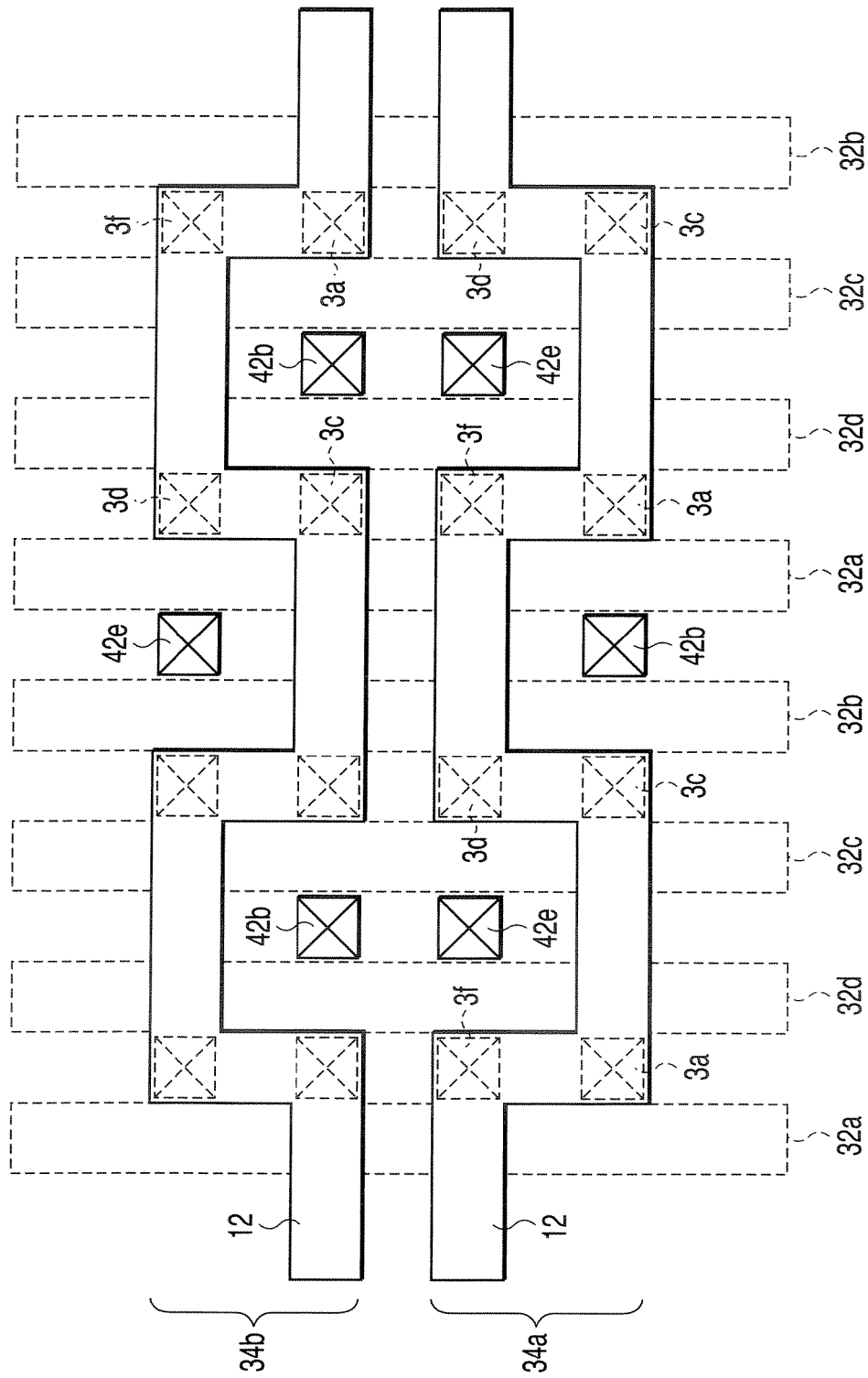
Figure 29:
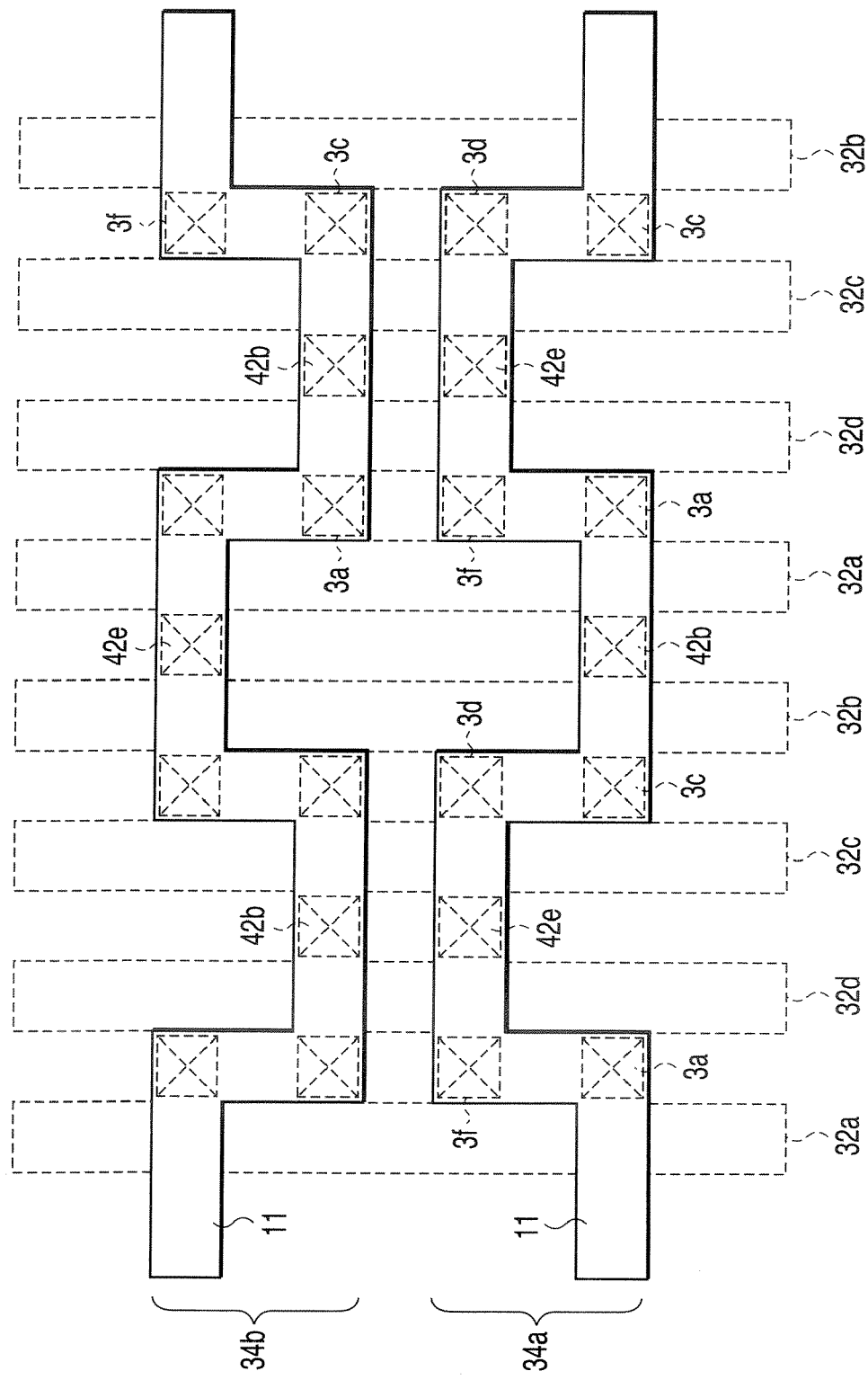

Description will be given on the application of the fourth modification of the first embodiment on the third embodiment. FIG. 27 to FIG. 29 shows a top plan view of another memory cell array according to the third embodiment. FIG. 27 shows a top plan view from a semiconductor substrate to plugs. FIG. 28 shows a top plan view up to the interconnect at the first level and magnetoresistance effect element. FIG. 29 shows a top plan view of the interconnect of the second level.

As illustrated in FIG. 27 to FIG. 29, the unit basic structure 34b has the same as FIG. 15. Specifically, source/drain diffusion areas 41f and 41a are formed between gate electrodes 32b and 32c. A source/drain diffusion area 41b is formed between gate electrodes 32c and 32d. Source/drain diffusion areas 41c and 41d are formed between gate electrodes 32d and 32a. A source/drain diffusion area 41e is formed between gate electrodes 32a and 32b. The upper layer is the same structure as the fourth embodiment of the first embodiment.

The third embodiment brings the same effect as the first embodiment.

Fourth Embodiment

The fourth embodiment differs from the first embodiment in arrangement of the unit basic structure 34b.

Figure 16:
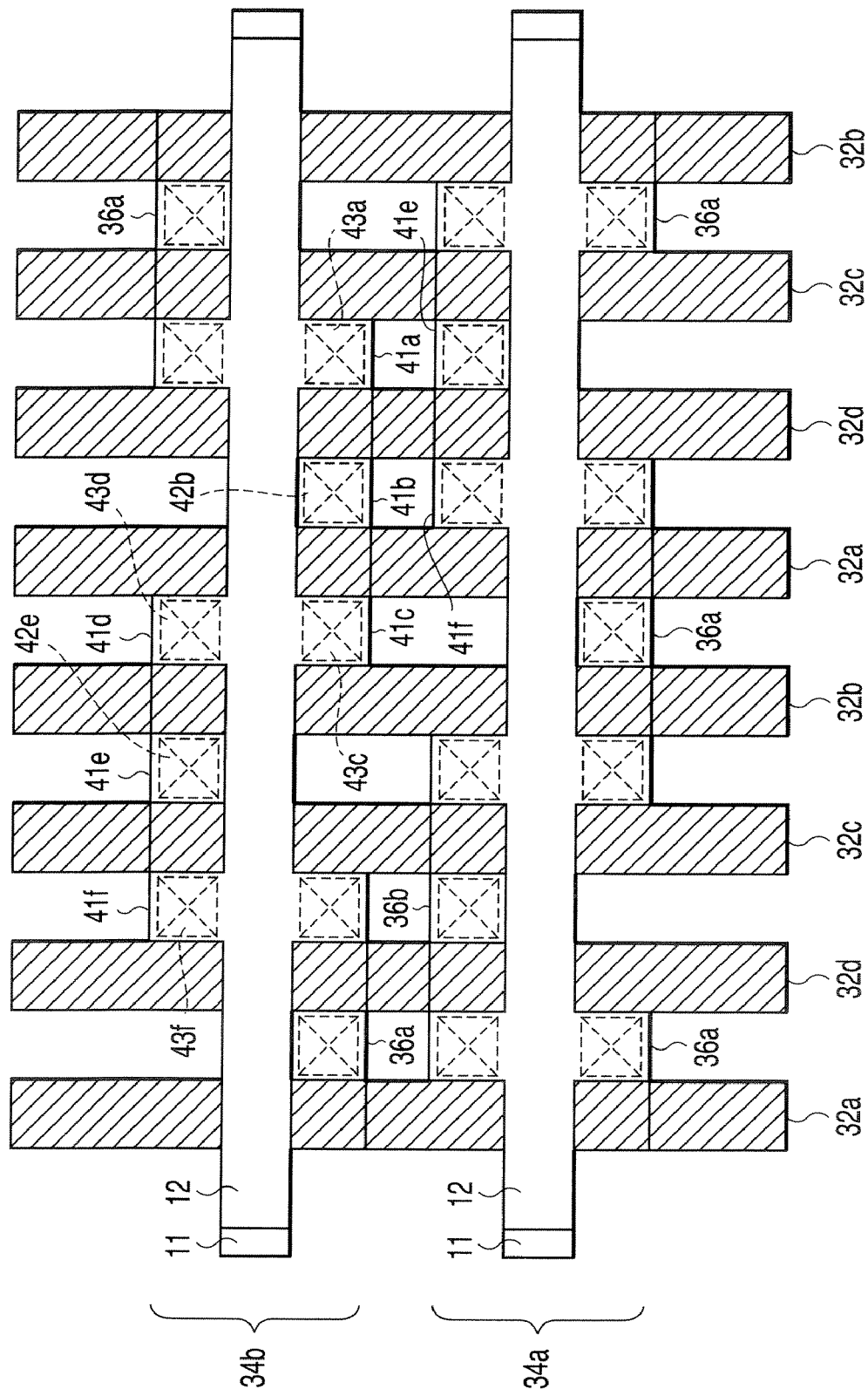
FIG. 16 shows a top plan view of the memory cell array according to a fourth embodiment.

FIG. 16 shows a top plan view of part of a memory cell array according to a second embodiment. As shown in FIG. 16, the structure of each feature in the unit basic structure 34b remains the same but the positional relationship between source/drain diffusion area 41 and gate electrode 32 differs from the first embodiment. In other words, position of source/ drain diffusion areas 41a to 41f of the unit basic structure 34b are shifted to inter-gate electrode area, which is area between gate electrodes 32, for three inter-gate electrode area from the first embodiment to the left or one inter-gate electrode area from the first embodiment to the right.

Specifically, source/drain diffusion areas 41f and 41a are formed between gate electrodes 32c and 32d. A source/drain diffusion area 41b is formed between gate electrodes 32d and 32a. Source/drain diffusion areas 41c and 41d are formed between gate electrodes 32a and 32b. A source/drain diffusion area 41e is formed between gate electrodes 32b and 32c.

Plugs 43a, 42b, 43c, 43d, 42e and 43f, magnetoresistance effect elements 3a to 3f, projected parts 12a, 11b, 12c, 12d, 11e and 12f of interconnects 11, 12 are formed above source/ drain diffusion areas 41a to 41f, respectively, like the first embodiment. The unit basic structure 34a is the same as the first embodiment.

The fourth embodiment brings the same effect as the first embodiment.

Fifth Embodiment

The first embodiment includes one interconnect 11 for one interconnect 12. On the contrary, the fifth embodiment includes two interconnects 11 for one interconnect 12.

Figure 17:
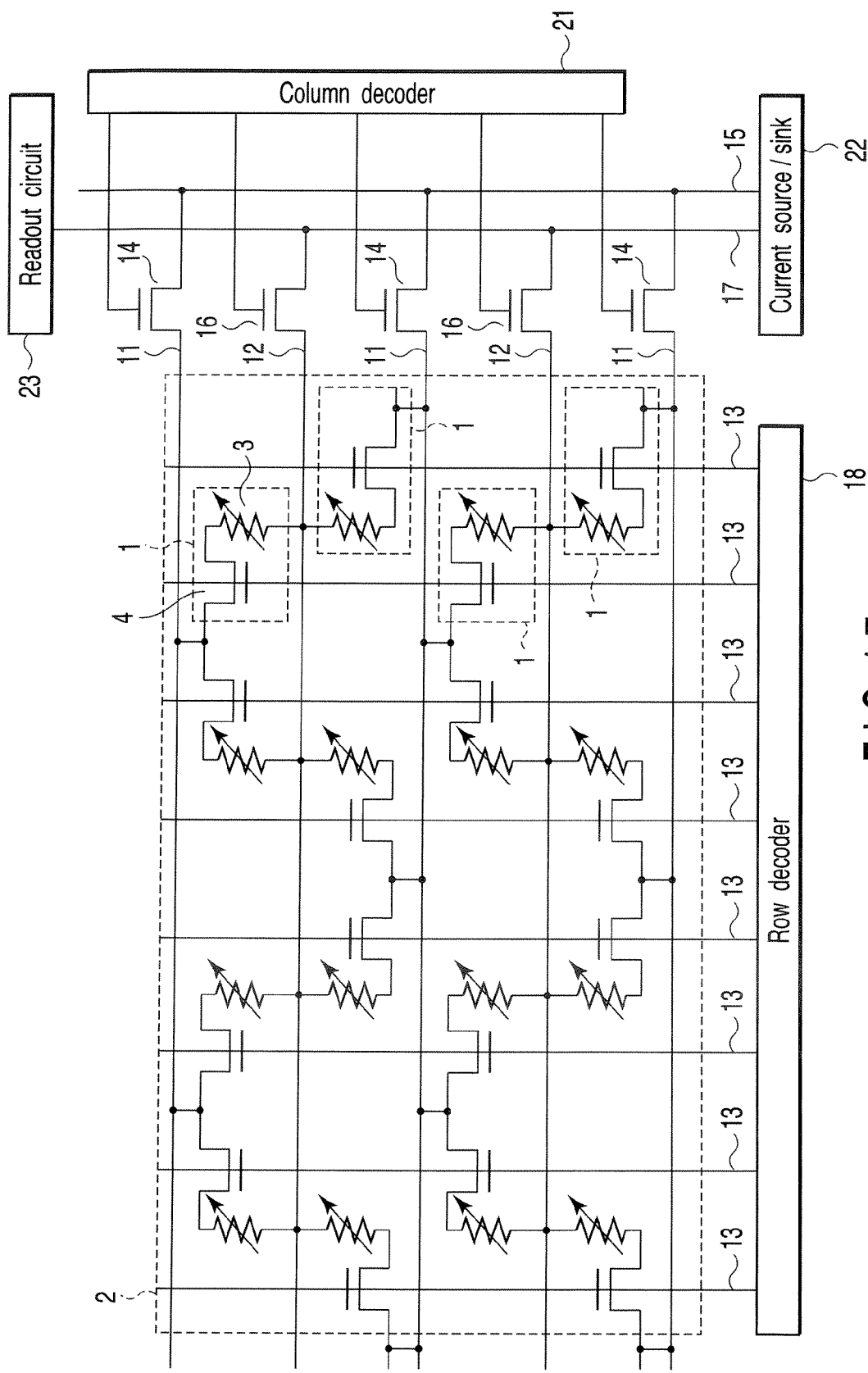
FIG. 17 shows a circuit block diagram of a magnetic memory device according to a fifth embodiment.

FIG. 17 shows a circuit diagram of a magnetic memory device according to a fifth embodiment. As seen from FIG. 17, a memory cell 1 has one terminal connected to an interconnect 12 and the other terminal connected to one of two interconnects 11. One interconnect 12 and two interconnects 11 connected to the interconnect 12 via the memory cell 1 form an interconnect group.

The interconnect 11 is shared between two interconnect groups. Other circuit configuration is the same as the first embodiment.

Figure 19:
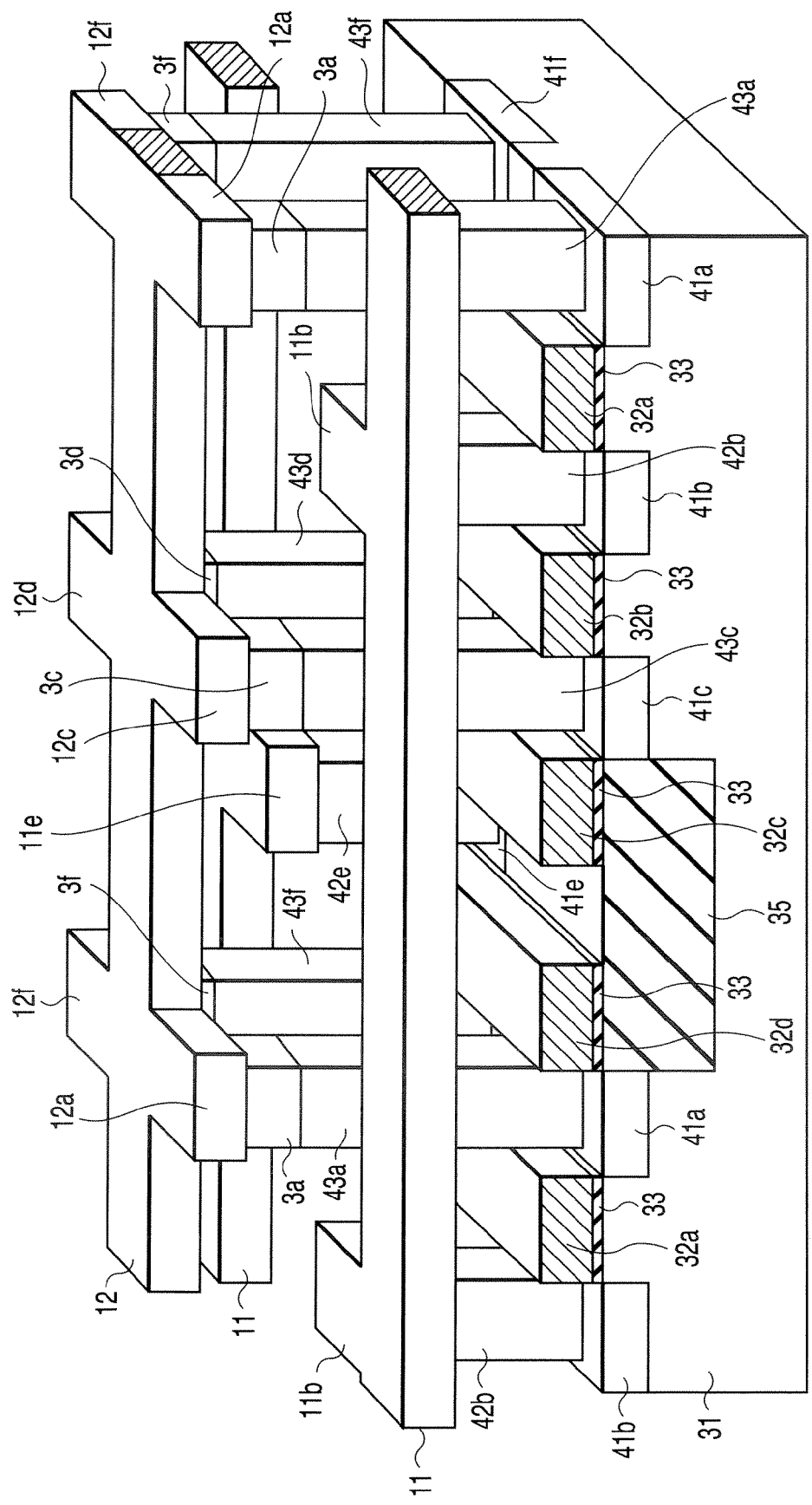
FIG. 19 shows a perspective view of the memory cell array according to the fifth embodiment.

The structure of the magnetic memory device according to the fifth embodiment will be described below with reference to FIG. 18 and FIG. 19. FIG. 18 shows a top plan view of part of a memory cell array according to the fifth embodiment. FIG. 19 shows a perspective view of the memory cell array according to the fifth embodiment.

As depicted in FIG. 18 and FIG. 19, the fifth embodiment is the same as the first embodiment (see FIG. 4 and FIG. 5) except for the structure of the interconnect 11. The interconnect 11 lies above a region between the source/drain diffusion areas 41f and 41a and a region between the source/drain diffusion areas 41c and 41d. The interconnect 11 has projected parts 11b and 11e above plugs 42b and 42e, like the first embodiment. The projected parts 11b and 11e are respectively connected to the upper surfaces of plugs 42b and 42e.

The fifth embodiment can achieve wide pitch between two adjacent interconnects 11 and between two adjacent interconnects 12 to readily arrange pass transistors and realize high integration of the magnetic memory device at the same time.

Sixth Embodiment

The sixth embodiment relates to an arrangement of pass transistors and is additionally used for the first to fifth embodiments.

Figure 20:
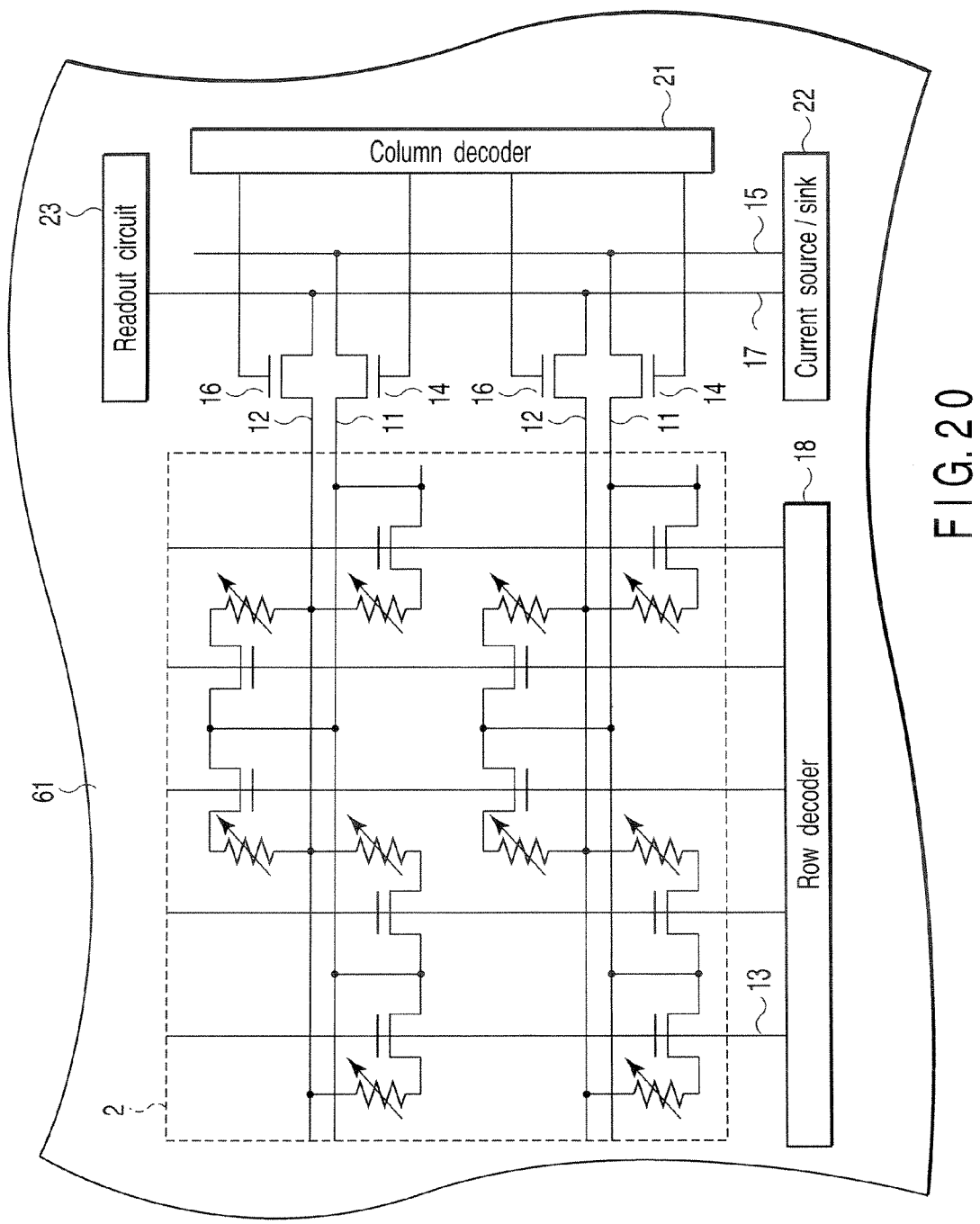
FIG. 20 to FIG. 23 show block diagrams of a circuit layout of a magnetic memory device according to a sixth embodiment.
Figure 21:
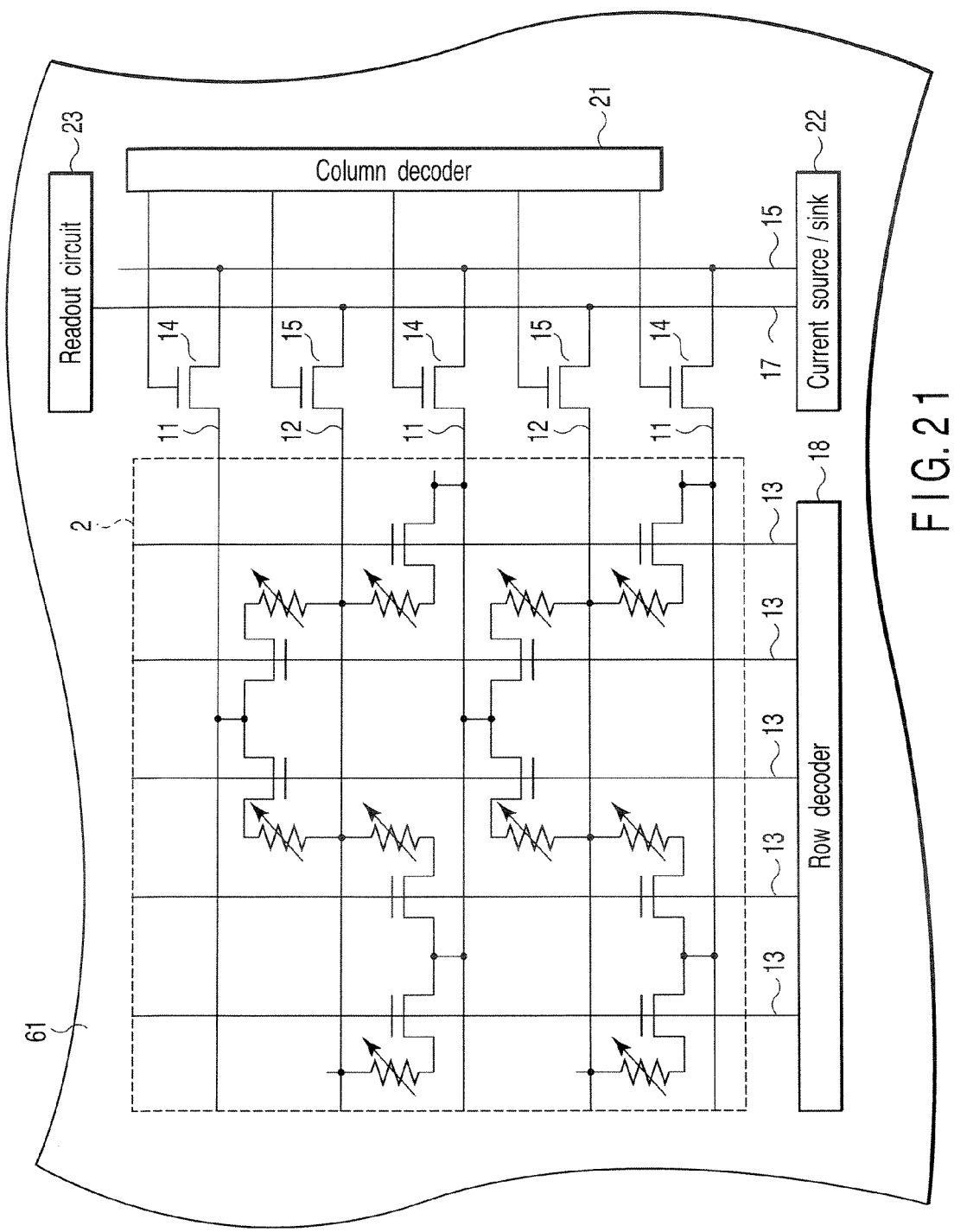

FIG. 20 and FIG. 21 show the layout of a magnetic memory device according to a sixth embodiment. FIG. 20 shows application of the sixth embodiment to the memory cell array structure of the first embodiment. FIG. 21 shows application of the sixth embodiment to the memory cell array structure of the fifth embodiment.

As illustrated in FIG. 20 and FIG. 21, memory cell array 2, row decoder 18, column decoder 21, current source/sink 22 and readout circuit are arranged on a semiconductor substrate 31.

Interconnects 11 and 12 extend along the horizontal direction on the plane of the semiconductor substrate 31. Pass transistors 14 and 16 are connected to the same side (right side in the drawings) of interconnects 11 and 12. The row decoder 18 is arranged at the lower side of the memory cell array 2. The column decoder 21 is arranged at the right side of a pair of pass transistors 14 and 16.

Common lines 15 and 17 extend along the vertical direction on the surface of the semiconductor substrate 31. Current source/sink 22 and readout circuit 23 are respectively arranged at upper and lower ends of common lines 15 and 17.

Figure 22:
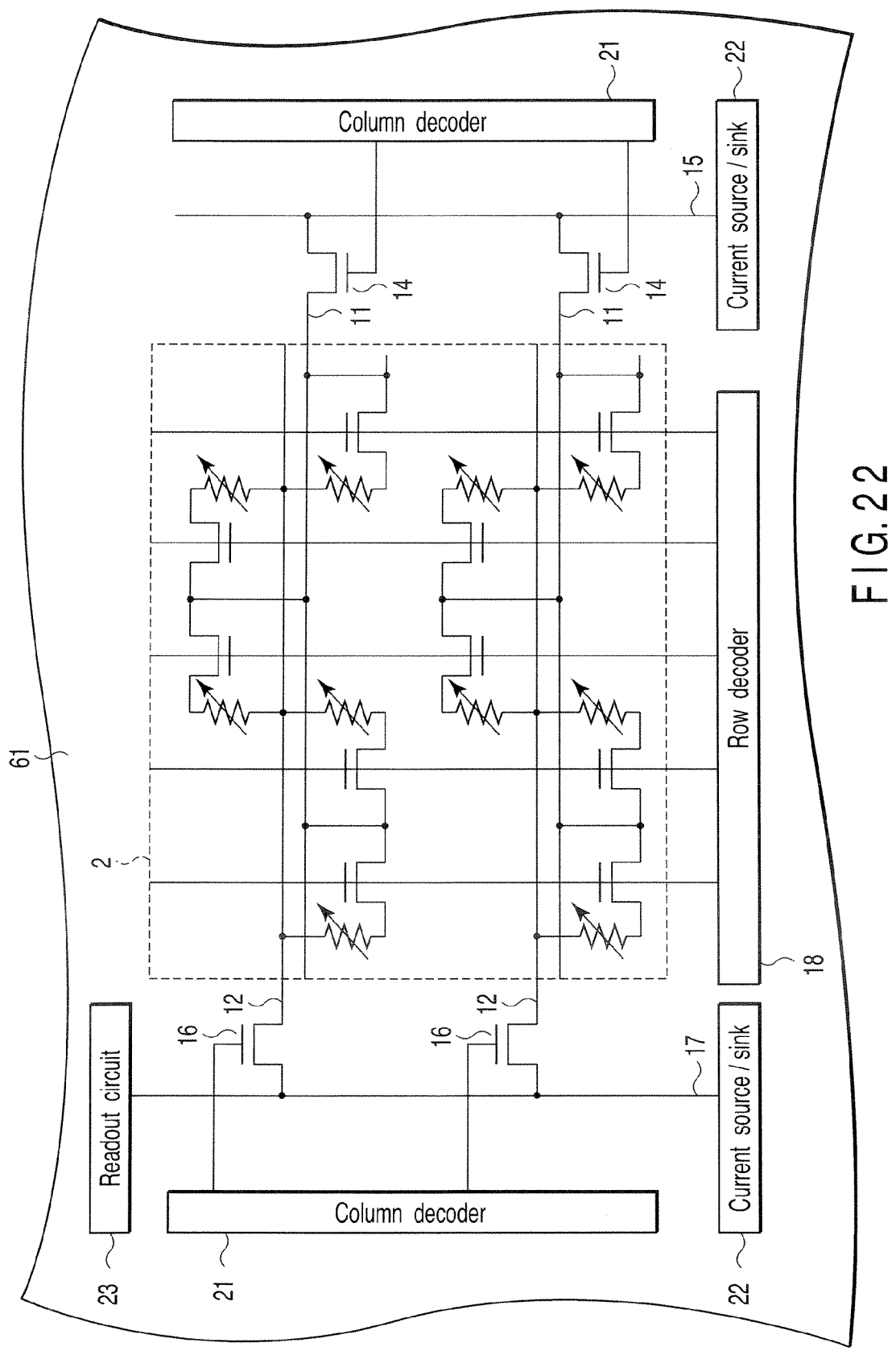
Figure 23:
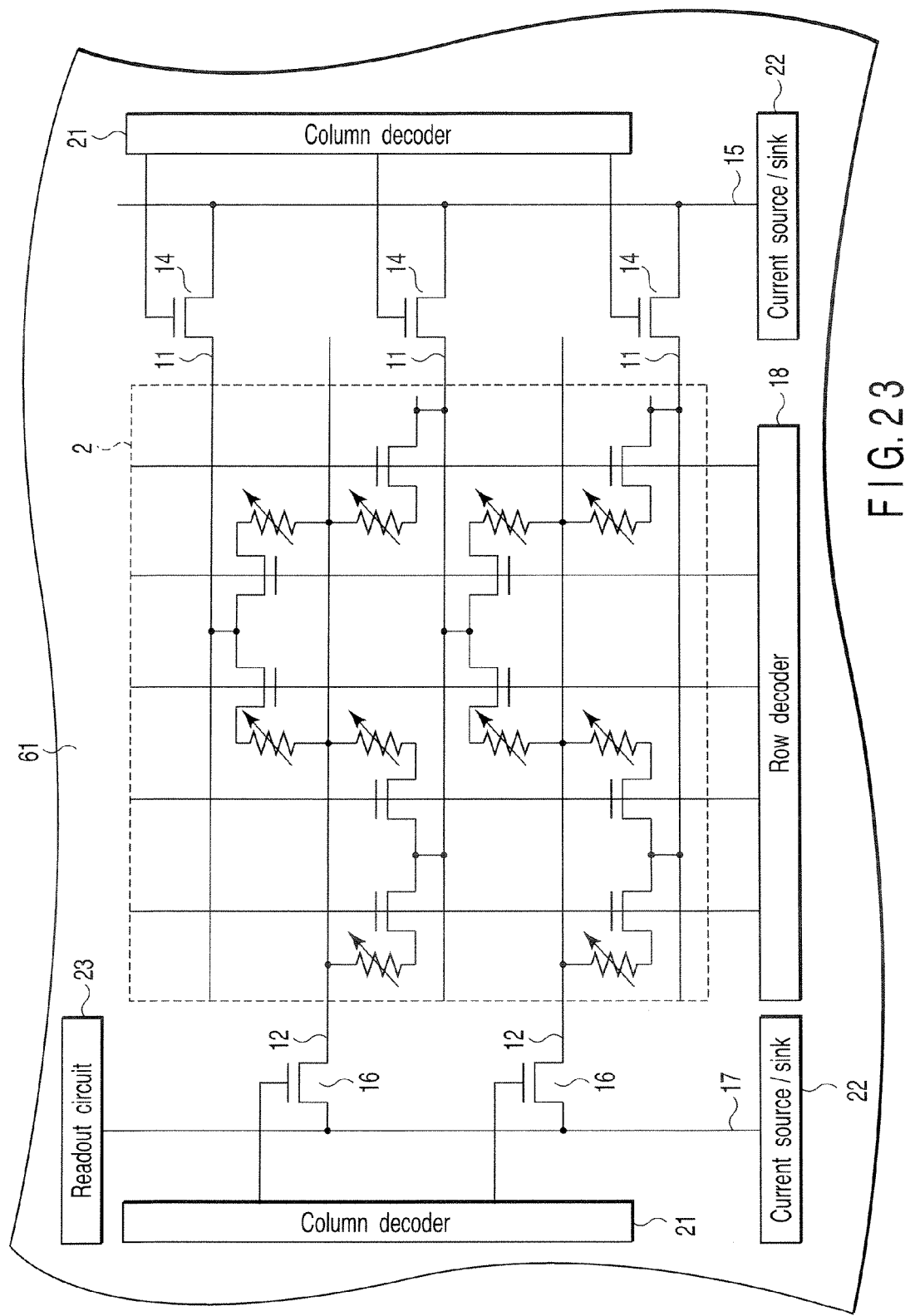

The layout shown in FIG. 22 and FIG. 23 may be employed. FIG. 22 and FIG. 23 show the layout of another magnetic memory device according to the sixth embodiment. FIG. 22 and FIG. 23 correspond respectively to each structure of the memory cell arrays according to the first and fifth embodiments, respectively.

As seen from FIG. 22 and FIG. 23, the pass transistor 14 is each connected to the interconnect 11 at one side (e.g., right side) of right and left sides of the memory cell array. On the other hand, the pass transistor 16 is each connected to the interconnect 11 at the other side (e.g., left side) of right and left sides of the memory cell array. In accordance with the arrangement of the pass transistors 14 and 16, the common line 15 is arranged at the right side of the memory cell array while the common line 17 is arranged at the left side thereof.

One current source/sink 22 is provided for each of common lines 15 and 17 and the current source/sink 22 each has one system unlike FIG. 3. Specifically, one current source/sink 24 is provided within one current source/sink 22.

The structure shown in FIG. 22 and FIG. 23 can realize constant length of paths between source/sink 22 and source/sink 24 via the interconnect 11, memory cell 1 and interconnect 12, regardless of the position of the memory cell 1. This property can stabilize the characteristics among memory cells 1 and realize a magnetic memory device with a large operation margin.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin injection write type magnetic memory device comprising:
   a semiconductor substrate;
   a first gate electrode provided on a gate insulating film provided on the semiconductor substrate, and extending along a first direction;
   a first diffusion area and a second diffusion area formed on a surface of the semiconductor substrate and sandwiching the first gate electrode;
   a first plug provided on the first diffusion area;
   a second plug provided on the second diffusion area;
   a first magnetoresistance element provided on the second plug;
   a second gate electrode provided on a gate insulating film provided on the semiconductor substrate, and extending in parallel with the first gate electrode;
   a third diffusion area and a fourth diffusion area formed on the surface of the semiconductor substrate and sandwiching the second gate electrode, the first and second gate electrodes sandwiching the second and fourth diffusion areas, the fourth diffusion area and the second diffusion area being positioned in a line along the first direction;
   a third plug provided on the third diffusion area;
   a fourth plug provided on the fourth diffusion area;
   a second magnetoresistance effect element provided on the fourth plug;
   a first interconnect connected to upper surfaces of the first and third plugs; and
   a second interconnect connected to upper surfaces of the first and second magnetoresistance effect elements.

2. The device according to claim 1, wherein
   the first interconnect has a first straight part, a first part projecting from the first straight part above the first plug, and a second part projecting from the first straight part above the third plug, and
   the second interconnect has a second straight part, a third part projecting from the second straight part above the second plug, and a fourth part projecting from the second straight part above the fourth plug.

3. The device according to claim 2, wherein the first straight part extends along the second straight part below or above the second straight part.

4. The device according to claim 2, wherein
   the first to fourth diffusion areas, the first to fourth plugs, the first and second magnetoresistance effect elements, the first and second interconnects form a first unit structure,
   the device further comprises a second unit structure identical to the first unit structure,
   the first and second unit structures are adjacent along the first direction.

5. The device according to claim 4, wherein the first and second unit structures are in symmetry with respect to an imaginary line along a second direction perpendicular to the first direction.

6. The device according to claim 1, wherein
   the first interconnect lies above the second interconnect,
   the second interconnect has a line including a first part extending above the second and fourth plugs, a second part extending along a second direction crossing the first direction from a region above the second plug to an opposite region to the first plug, and a third part extending along the second direction from a region above the fourth plug to an opposite region to the third plug.

7. The device according to claim 6, wherein
the first interconnect has a line including a fourth part extending above the second and fourth plugs, a fifth part extending above the first and second plugs, and a sixth part extending above the third and fourth plugs.

8. The device according to claim 7, wherein
the first to fourth diffusion areas, the first to fourth plugs, the first and second magnetoresistance effect elements, the first and second interconnects form a first unit structure,
the device further comprises a second unit structure identical to the first unit structure,
the first and second unit structures are adjacent along the first direction.

9. The device according to claim 8, wherein the first and second unit structures are in symmetry with respect to an imaginary line along the second direction.

10. The device according to claim 1, further comprising:
a third gate electrode provided on a gate insulating film provided on the semiconductor substrate, and extending in parallel with the first gate electrode, the first and third gate electrodes sandwiching the first plug;
a fifth diffusion area formed on the surface of the semiconductor substrate, the first and fifth diffusion areas sandwiching the third gate electrode;
a fifth plug provided on the fifth diffusion area;
a third magnetoresistance effect element provided on the fifth plug, an upper surface of the third magnetoresistance effect element being connected to the second interconnect;
a fourth gate electrode provided on a gate insulating film provided on the semiconductor substrate, and extending in parallel with the second gate electrode, the second and fourth gate electrodes sandwiching the third plug;
a sixth diffusion area formed on the surface of the semiconductor substrate, the third and sixth diffusion areas sandwiching the fourth gate electrode;
a sixth plug provided on the sixth diffusion area; and
a fourth magnetoresistance effect element provided on the sixth plug, an upper surface of the fourth magnetoresistance effect element being connected to the second interconnect.

11. The device according to claim 10, wherein
the first interconnect has a first straight part, a first part projecting from the first straight part above the first plug, and a second part projecting from the first straight part above the third plug, and
the second interconnect has a second straight part, a third part projecting from the second straight part above the second plug, a fourth part projecting from the second straight part above the fourth plug, a fifth part projecting from the second straight part above the fifth plug, and a sixth part projecting from the second straight part above the sixth plug.

12. The device according to claim 10, wherein the first straight part extends along the second straight part below or above the second straight part.

13. The device according to claim 10, wherein
the first to sixth diffusion areas, the first to sixth plugs, the first to fourth magnetoresistance effect elements, the first and second interconnects form a first unit structure,
the device further comprises a second unit structure identical to the first unit structure,
the first and second unit structures are adjacent along the first direction.

14. The device according to claim 13, wherein the first and second unit structures are in symmetry with respect to an imaginary line along a second direction perpendicular to the first direction.

15. The device according to claim 10, wherein
the first interconnect has a first straight part, a first part projecting from the first straight part above the first plug, and a second part projecting from the first straight part above the third plug, and
the second interconnect has a second straight part extending along a imaginary line connecting the second and fifth plugs above the second and fifth plugs, a third part projecting from the second straight part above the fourth plug, and a fourth part projecting from the second straight part above the sixth plug.

* * * * *